US009594726B2

(12) United States Patent
Macready et al.

(10) Patent No.: US 9,594,726 B2
(45) Date of Patent: Mar. 14, 2017

(54) SYSTEMS AND METHODS FOR SOLVING COMPUTATIONAL PROBLEMS

(71) Applicant: D-Wave Systems Inc., Burnaby (CA)

(72) Inventors: William G. Macready, West Vancouver (CA); Geordie Rose, Vancouver (CA); Thomas F. W. Mahon, Vancouver (CA); Peter Love, Haverford, PA (US); Marshall Drew-Brook, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 0 days.

(21) Appl. No.: 15/190,608

(22) Filed: Jun. 23, 2016

(65) Prior Publication Data

US 2016/0371227 A1 Dec. 22, 2016

Related U.S. Application Data

(60) Continuation of application No. 14/186,895, filed on Feb. 21, 2014, now Pat. No. 9,405,876, which is a
(Continued)

(51) Int. Cl.
*G06F 17/11* (2006.01)
*G06N 99/00* (2010.01)
*B82Y 10/00* (2011.01)

(52) U.S. Cl.
CPC .............. *G06F 17/11* (2013.01); *B82Y 10/00* (2013.01); *G06N 99/002* (2013.01)

(58) Field of Classification Search
CPC ..... B82Y 10/00; G06N 99/002; G06F 17/505; G06F 17/11
See application file for complete search history.

(56) References Cited

U.S. PATENT DOCUMENTS 7,135,701 B2 11/2006 Amin et al.
7,533,068 B2 5/2009 Maassen van den Brink et al.
(Continued)

FOREIGN PATENT DOCUMENTS

CA WO 2009143166 A2 * 11/2009 ............. B82Y 10/00
WO 2009/120638 A2 10/2009
(Continued)

OTHER PUBLICATIONS

Hidetoshi Nishimori, "Quantum Annealing: Quantum computing for combinatorial optimization problems", 2016, retrieved from http://www.stat.phys.titech.ac.jp/~nishimori/QA/q-annealing_e. html.*
(Continued)

*Primary Examiner* — Matthew Sandifer
(74) *Attorney, Agent, or Firm* — Seed IP Law Group LLP

(57) ABSTRACT

Solving computational problems may include generating a logic circuit representation of the computational problem, encoding the logic circuit representation as a discrete optimization problem, and solving the discrete optimization problem using a quantum processor. Output(s) of the logic circuit representation may be clamped such that the solving involves effectively executing the logic circuit representation in reverse to determine input(s) that corresponds to the clamped output(s). The representation may be of a Boolean logic circuit. The discrete optimization problem may be composed of a set of miniature optimization problems, where each miniature optimization problem encodes a respective logic gate from the logic circuit representation. A quantum processor may include multiple sets of qubits, each set coupled to respective annealing signal lines such that dynamic evolution of each set of qubits is controlled independently from the dynamic evolutions of the other sets of qubits.

17 Claims, 20 Drawing Sheets

Related U.S. Application Data division of application No. 12/992,047, filed as application No. PCT/US2010/038867 on Jun. 16, 2010, now Pat. No. 8,700,689.

(60) Provisional application No. 61/330,789, filed on May 3, 2010, provisional application No. 61/238,043, filed on Aug. 28, 2009, provisional application No. 61/187,987, filed on Jun. 17, 2009.

(56) References Cited

U.S. PATENT DOCUMENTS

| | | |
|---|---|---|
| 7,844,656 B2 | 11/2010 | Macready et al. |
| 7,895,142 B2 | 2/2011 | Neigovzen et al. |
| 8,111,083 B1 | 2/2012 | Pesetski et al. |
| 8,386,554 B2 | 2/2013 | Macready et al. |
| 8,560,282 B2 | 10/2013 | Macready et al. |
| 8,700,689 B2 | 4/2014 | Macready et al. |
| 9,405,876 B2 | 8/2016 | Macready et al. |
| 2002/0157009 A1 | 10/2002 | Yamamoto et al. |
| 2003/0164490 A1 | 9/2003 | Blais |
| 2005/0066301 A1 | 3/2005 | Lorenz et al. |
| 2006/0075365 A1 | 4/2006 | Hershenson et al. |
| 2006/0259283 A1 | 11/2006 | Brughmans et al. |
| 2007/0080341 A1 | 4/2007 | Macready et al. |
| 2007/0180586 A1 | 8/2007 | Amin |
| 2008/0109500 A1 | 5/2008 | Macready et al. |
| 2008/0176750 A1 | 7/2008 | Rose et al. |
| 2008/0215850 A1 | 9/2008 | Berkley et al. |
| 2009/0033369 A1 | 2/2009 | Baumgardner et al. |
| 2009/0070402 A1 | 3/2009 | Rose et al. |
| 2009/0118970 A1 | 5/2009 | Daum et al. |
| 2009/0121215 A1 | 5/2009 | Choi |
| 2010/0182039 A1 | 7/2010 | Baumgardner et al. |
| 2011/0231462 A1 | 9/2011 | Macready et al. |
| 2013/0144925 A1 | 6/2013 | Macready et al. |

FOREIGN PATENT DOCUMENTS

| | | |
|---|---|---|
| WO | 2009/143166 A2 | 11/2009 |
| WO | 2010/148120 A2 | 12/2010 |

OTHER PUBLICATIONS

G. Rose and W. G. Macready, "An introduction to quantum annealing", DWAVE Technical Document 0712, 2007.*

Amin, "Effect of Local Minima on Adiabatic Quantum Optimization," *Physical Review Letters* 100:130503-1-130503-4, 2008.

Beckman et al., "Efficient networked for quantum factoring," *Phys. Rev. A.* 54:1034-1063, arXiv:quant-ph/960201v1, 56 pages, 1996.

Burges, "Factoring as Optimization," Microsoft Technical Report MSR-TR-2002-83, 19 pages, 2002.

Farhi et al., "Quantum Adiabatic Evolution Algorithms versus Simulated Annealing," arXi:quant-ph/0201031v1, 2002, 16 pages.

International Search Report, mailed Feb. 7, 2011, for International Application No. PCT/US2010/038867, 3 pages.

Laskari et al., "Problems of cryptography as discrete optimization tasks," *Nonlinear Analysis* 36:e831-e837, 2005.

Macready et al., "Systems and Methods for Solving Computational Problems," U.S. Appl. No. 61/187,987, filed Jun. 17, 2009, 29 pages.

Macready et al., "Systems and Methods for Solving Factoring Problems," U.S. Appl. No. 61/238,043, filed Aug. 28, 2009, 29 pages.

Macready et al., "Systems and Methods for Solving Computational Problems," U.S. Appl. No. 61/330,789, filed May 3, 2010, 42 pages.

Macready et al., "Systems and Methods for Solving Computational Problems," Notice of Allowance, mailed Jan. 20, 2015, for U.S. Appl. No. 13/678,266, 10 pages.

Shor, "Polynomial-Time Algorithms for Prime Factorization and Discrete Logarithms on a Quantum Computer," AT&T Report, arXiv:quant-ph/9508027v2, 28 pages, 1996.

Written Opinion of the International Searching Authority, mailed Feb. 7, 2011, for International Application No. PCT/US2010/038867, 3 pages.

* cited by examiner

SYSTEMS AND METHODS FOR SOLVING COMPUTATIONAL PROBLEMS

BACKGROUND

Field

The present systems, methods and articles generally relate to solving computational problems and particularly relate to solving discrete optimization problems and/or constraint satisfaction problems by reverse or undirected execution of their corresponding logic circuit representations.

Discrete Optimization

In mathematics and computer science, an optimization problem is one in which an optimal value of at least one parameter is sought. Typically, the parameter in question is defined by an objective function which comprises at least one variable. The optimal value of the parameter is then achieved by determining the value(s) of the at least one variable that maximize or minimize the objective function.

Discrete optimization is simply a special-case of optimization for which the variables used in the objective function are restricted to assume only discrete values. For example, the variables in the objective function may be restricted to all or a subset of the integers.

Constraint Satisfaction

The maximization or minimization of the objective function in an optimization problem (discrete or otherwise) is typically subject to a set of constraints, where a valid result may be required to satisfy all, or at least a subset, of the constraints. In some applications, simply finding a solution that satisfies all, or a subset, of the constraints may be all that is desired (i.e., there may be no additional objective function requiring maximization or minimization). Such problems are known as "constraint satisfaction problems" and may be viewed as a class of optimization problems in which the objective function is a measure of how well the constraints are (or are not) satisfied. Thus, throughout the remainder of this specification, the term "optimization problem" is used to encompass all forms of optimization problems, including constraint satisfaction problems.

Quadratic Unconstrained Binary Optimization Problems

A quadratic unconstrained binary optimization ("QUBO") problem is a form of discrete optimization problem that involves finding a set of N binary variables $\{x_i\}$ that minimizes an objective function of the form:

$$E(x_1, \ldots, x_N) = \sum_{i \leq j}^{N} Q_{ij} x_i x_j$$

where Q is typically a real-valued upper triangular matrix that is characteristic of the particular problem instance being studied. QUBO problems are known in the art and applications arise in many different fields, for example machine learning, pattern matching, economics and finance, and statistical mechanics, to name a few.

Logic Circuits

For any problem that can be solved, a solution may be reached by following a prescribed set of steps. In many cases, the prescribed set of steps may be designed to include a set of logical steps called "logical operations." Logical operations are the fundamental steps that are typically implemented in digital electronics and most classical computer algorithms.

For many computational problems, a sequence of steps that leads to a solution can be described by a logic circuit representation. A logic circuit representation includes at least one logical input that is transformed to at least one logical output through at least one logical operation. A logic circuit representation may include any number of logical operations arranged either in series or in parallel (or a combination of series and parallel operations), where each logical operation has a corresponding set of at least one intermediate logical input and at least one intermediate logical output. Throughout this specification and the appended claims, the terms "intermediate logical input" and "intermediate logical output" are often used. Unless the specific context requires otherwise, the term "intermediate" here is intended to denote an input to/output from an individual logic gate which is an intermediate input/output with respect to the overall logic circuit. However, those of skill in the art will appreciate that a logical input to a logic circuit may correspond to an intermediate logical input to a particular logic gate, and similarly a logical output from a logic circuit may correspond to an intermediate logical output from a particular logic gate. For a first logical operation arranged in series with a second logical operation, at least one intermediate logical output from the first logical operation may correspond to at least one intermediate logical input to the second logical operation.

Each logical operation in a logic circuit is represented by a logic gate, for example, the NAND gate or the XOR gate, or a combination of logic gates. A logical operation may include any number of logic gates arranged either in series or in parallel (or a combination of series and parallel gates), where each logic gate has a corresponding set of at least one intermediate logical input and at least one intermediate logical output. For a first logic gate arranged in series with a second logic gate, at least one intermediate logical output from the first logic gate may correspond to at least one intermediate logical input to the second logic gate. The complete logic circuit representation of a computational problem may include any number of intermediate logical operations which themselves may include any number of intermediate logic gates. Furthermore, the at least one logical input to the logic circuit representation may traverse any number of intermediate logical inputs and intermediate logical outputs in being transformed to the at least one logical output from the logic circuit representation. Unless the specific context requires otherwise, throughout the remainder of this specification and the appended claims the terms "logical input" and "logical output" are used to generally describe any inputs and outputs in a logic circuit representation, including intermediate inputs and outputs.

In some implementations, one or more logical inputs may produce a plurality of logical outputs. For example, if the circuit, an operation, or a gate produces an N-bit number as the result, then N logical outputs may be required to represent this number. Alternatively, one or more logical inputs may produce a single logical output. For example, if the circuit, an operation, or a gate produces TRUE or FALSE as the result, then only one logical output may be required to convey this information. A circuit that produces TRUE or FALSE as the result embodies "Boolean logic" and is sometimes referred to as a "Boolean circuit." Boolean circuits are commonly used to represent NP-complete constraint satisfaction problems.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165 (now U.S. Pat. No. 7,533,068), US Patent Publication 2008-0176750, U.S. patent application Ser. No. 12/266,378 published as U.S. Patent Publication 2009-0121215, and PCT Patent Application Serial No. PCT/US09/37984 published as PCT Patent Publication 2009-120638.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is:

$$H_e = (1-s)H_i + sH_f$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can be excited to a higher energy state, such as the first excited state. In the present systems, methods, and apparatus, an "adiabatic" evolution is considered to be an evolution that satisfies the adiabatic condition:

$$\dot{s}|<1|dH_e/ds|0<|=\delta g^2(s)$$

where is the time derivative of s, g(s) is the difference in energy between the ground state and first excited state of the system (also referred to herein as the "gap size") as a function of s, and δ is a coefficient much less than 1.

The evolution process in adiabatic quantum computing may sometimes be referred to as annealing. The rate that s changes, sometimes referred to as an evolution or annealing schedule, is normally slow enough that the system is always in the instantaneous ground state of the evolution Hamiltonian during the evolution, and transitions at anti-crossings (i.e., when the gap size is smallest) are avoided. Further details on adiabatic quantum computing systems, methods, and apparatus are described in U.S. Pat. No. 7,135,701.

Quantum Annealing

Quantum annealing is a computation method that may be used to find a low-energy state, typically preferably the ground state, of a system. Similar in concept to classical annealing, the method relies on the underlying principle that natural systems tend towards lower energy states because lower energy states are more stable. However, while classical annealing uses classical thermal fluctuations to guide a system to its global energy minimum, quantum annealing may use quantum effects, such as quantum tunneling, to reach a global energy minimum more accurately and/or more quickly. It is known that the solution to a hard problem, such as a combinatorial optimization problem, may be encoded in the ground state of a system Hamiltonian and therefore quantum annealing may be used to find the solution to such hard problems. Adiabatic quantum computation is a special case of quantum annealing for which the system, ideally, begins and remains in its ground state throughout an adiabatic evolution. Thus, those of skill in the art will appreciate that quantum annealing systems and methods may generally be implemented on an adiabatic quantum computer, and vice versa. Throughout this specification and the appended claims, any reference to quantum annealing is intended to encompass adiabatic quantum computation unless the context requires otherwise.

Quantum annealing is an algorithm that uses quantum mechanics as a source of disorder during the annealing process. The optimization problem is encoded in a Hamiltonian $H_P$, and the algorithm introduces strong quantum fluctuations by adding a disordering Hamiltonian $H_D$ that does not commute with $H_P$. An example case is:

$$H_E = H_P + \Gamma H_D,$$

where $\Gamma$ changes from a large value to substantially zero during the evolution and $H_E$ may be thought of as an evolution Hamiltonian similar to $H_e$ described in the context of adiabatic quantum computation above. The disorder is slowly removed by removing $H_D$ (i.e., reducing $\Gamma$). Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in a local minimum close to the exact solution; the slower the evolution, the better the solution that will be achieved. The performance of the computation may be assessed via the residual energy (distance from exact solution using the objective function) versus evolution time. The computation time is the time required to generate a residual energy below some acceptable threshold value. In quantum annealing, $H_P$ may encode an optimization problem and therefore $H_P$ may be diagonal in the subspace of the qubits that encode the solution, but the system does not necessarily stay in the ground state at all times. The energy landscape of $H_P$ may be crafted so that its global minimum is the answer to the problem to be solved, and low-lying local minima are good approximations.

The gradual reduction of $\Gamma$ in quantum annealing may follow a defined schedule known as an annealing schedule. Unlike traditional forms of adiabatic quantum computation where the system begins and remains in its ground state throughout the evolution, in quantum annealing the system may not remain in its ground state throughout the entire annealing schedule. As such, quantum annealing may be implemented as a heuristic technique, where low-energy states with energy near that of the ground state may provide approximate solutions to the problem.

BRIEF SUMMARY

A method of solving a problem may be summarized as including generating a logic circuit representation of the problem using a computer processor, wherein the logic circuit representation includes at least one logical input, at least one logical output, and at least one logical operation that includes at least one logic gate; encoding the logic circuit representation as a discrete optimization problem using the computer processor; clamping at least one logical output; and solving the discrete optimization problem by executing the logic circuit to determine at least one logical input that corresponds to the at least one clamped logical output. The computer processor may include a classical digital computer processor, generating a logic circuit representation may include generating a logic circuit representation using the classical digital computer processor, and encoding the logic circuit representation may include encoding the logic circuit representation using the classical digital computer processor. The at least one clamped logical output may be an intermediate logical output of a logic gate. Solving the discrete optimization problem may include mapping the discrete optimization problem to a quantum processor including a set of qubits and a set of couplers. Mapping the discrete optimization problem to a quantum processor may include programming the qubits and couplers of the quantum processor in a configuration representing a problem Hamiltonian that corresponds to the discrete optimization problem. Solving the discrete optimization problem may include operating the quantum processor to perform at least one of an adiabatic quantum computation and an implementation of quantum annealing. In some embodiments, encoding the logic circuit representation as a discrete optimization problem may include encoding each respective logic gate from the logic circuit representation as a respective miniature optimization problem, wherein each respective miniature optimization problem is characterized by a respective objective function that is minimized when a truth table of the corresponding logic gate is obeyed. In such embodiments, mapping the discrete optimization problem to a quantum processor may include programming a respective one of each of a plurality of subsets of qubits and couplers in the quantum processor in a configuration representing a respective miniature optimization problem, wherein each miniature optimization problem encodes a respective logic gate in the logic circuit representation of the problem, and wherein each respective miniature optimization problem is characterized by a respective objective function that is minimized when a truth table of the corresponding logic gate is obeyed.

Generating a logic circuit representation may include generating a Boolean logic circuit representation using the computer processor. Solving the discrete optimization problem may include solving a quadratic unconstrained binary optimization problem. The problem may include a constraint satisfaction problem.

A method of solving a problem may be summarized as including generating, using a computer processor, a representation of a Boolean circuit to verify a solution to the problem, wherein an output of the Boolean circuit is TRUE if the solution is correct and the output of the Boolean circuit is FALSE if the solution is incorrect; encoding the representation of the Boolean circuit as a discrete optimization problem using a computer processor; clamping the output of the encoded representation of the Boolean circuit; and solving the discrete optimization problem using a computer processor to determine at least one input to the encoded representation of the Boolean circuit that corresponds to the clamped output. Solving the discrete optimization problem may include mapping the discrete optimization problem to a quantum processor and using the quantum processor to determine at least one input to the encoded representation of the Boolean circuit that corresponds to the clamped output. Using the quantum processor to determine at least one input to the encoded representation of the Boolean circuit that corresponds to the clamped output may include using the quantum processor to perform at least one of an adiabatic quantum computation and an implementation of quantum annealing. Generating a representation of a Boolean circuit may include generating a representation of a Boolean circuit using a classical digital computer processor, and encoding the representation of the Boolean circuit may include encoding the representation of the Boolean circuit using a classical digital computer processor. Encoding the representation of the Boolean circuit as a discrete optimization problem may include encoding the representation of the Boolean circuit as a quadratic unconstrained binary optimization problem using the classical digital computer processor.

The output of the encoded representation of the Boolean circuit may, for example, be clamped as TRUE and solving the discrete optimization problem may include determining at least one input to the encoded representation of the Boolean circuit that corresponds to the TRUE output. The output of the encoded representation of the Boolean circuit may, for example, be clamped as FALSE and solving the discrete optimization problem may include determining at least one input to the encoded representation of the Boolean circuit that corresponds to the FALSE output. The problem may include a constraint satisfaction problem.

A processor system for solving a computational problem, may be summarized as including a first processing subsystem that generates a logic circuit representation of the computational problem, wherein the logic circuit representation includes at least one logical input, at least one logical output, and at least one logical operation that includes at least one logic gate, and for encoding the logic circuit representation as a discrete optimization problem; and a second processing subsystem that solves the discrete optimization problem, the second processing subsystem including a plurality of computational elements; a programming subsystem that maps the discrete optimization problem to the plurality of computational elements by programming the computational elements of the second processing subsystem, wherein programming the computational elements of the second processing subsystem includes clamping at least one logical output of the logic circuit representation of the computational problem; and an evolution subsystem that evolves the computational elements of the second processing subsystem, wherein the computational elements of the second processing subsystem are evolved by determining at least one logical input that corresponds to the at least one clamped logical output. The first processing subsystem may include a classical digital computer processor and at least one of the computational problem, the logic circuit representation of the computational problem, and the discrete optimization problem may be stored in a computer-readable storage medium in the classical digital computer processor. The second processing subsystem may include a quantum processor and the plurality of computational elements may include at least two qubits and at least one coupler. The quantum processor may include a superconducting quantum processor, the at least two qubits may include superconducting qubits, and the at least one coupler may include a superconducting coupler. Processor executable instructions that cause a processor system to perform as such may be stored on at least one processor-readable storage medium. In some embodiments, the discrete optimization problem may include a plurality of miniature optimization problems such that each miniature optimization problem encodes a respective logic gate in the logic circuit representation of the computational problem. In such embodiments, the programming subsystem that maps the discrete optimization problem to the plurality of computational elements by programming the computational elements of the second processing subsystem may be further configured to map each respective miniature optimization problem to a respective subset of computational elements of the second processing subsystem.

A processor system for solving a computational problem may be summarized as including a first processing subsystem that generates a representation of a Boolean circuit to verify a solution to the computational problem, wherein an output of the Boolean circuit is TRUE if the solution is correct and the output of the Boolean circuit is FALSE if the solution is incorrect, and that encodes the Boolean circuit as a discrete optimization problem; and a second processing subsystem that solves the discrete optimization problem, the second processing subsystem including a plurality of computational elements; a programming subsystem that maps the discrete optimization problem to the plurality of computational elements by programming the computational elements of the second processing subsystem, wherein programming the computational elements of the second processing subsystem includes clamping the output of the Boolean circuit representation of the computational problem; and an evolution subsystem that evolves the computational elements of the second processing subsystem, wherein the computational elements of the second processing subsystem are evolved by determining at least one input to the Boolean circuit that corresponds to the clamped output. The first processing subsystem may include a classical digital computer processor and at least one of the computational problem, the Boolean circuit representation of the computational problem, and the discrete optimization problem may be stored in a computer-readable storage medium in the classical digital computer processor. The second processing subsystem may include a quantum processor and the plurality of computational elements may include at least two qubits and at least one coupler. The quantum processor may include a superconducting quantum processor, the at least two qubits may include superconducting qubits, and the at least one coupler may include a superconducting coupler. Processor executable instructions that cause a processor system to perform as such may be stored on at least one processor-readable storage medium.

A method of solving a factoring problem may be summarized as generating a logic circuit representation of the factoring problem using a computer processor; encoding the logic circuit representation as a discrete optimization problem using the computer processor; and solving the discrete optimization problem using a quantum processor. The factoring problem may include factoring an N bit integer p as a product of a pair of integers a and b.

A method of solving a factoring problem may be summarized as generating, using a first computer processor, a representation of a Boolean circuit to verify a solution to the factoring problem, wherein an output of the Boolean circuit is TRUE if the solution is correct and the output of the Boolean circuit is FALSE if the solution is incorrect; encoding the representation of the Boolean circuit as a discrete optimization problem using the first computer processor; clamping the output of the encoded representation of the Boolean circuit as TRUE; and solving the discrete optimization problem by using a second computer processor to determine at least one input to the encoded representation of the Boolean circuit that corresponds to the TRUE output. The factoring problem may include factoring an N bit integer p as a product of a pair of integers a and b.

A method of solving a factoring problem may be summarized as casting the factoring problem as a constraint satisfaction problem using a computer processor; casting the constraint satisfaction problem as an optimization problem using the computer processor; and solving the optimization problem using a quantum processor. In some embodiments, casting the factoring problem as a constraint satisfaction problem may include generating a logic circuit representation of the factoring problem using the computer processor.

In some embodiments, casting the constraint satisfaction problem as an optimization problem may include encoding the logic circuit representation as a discrete optimization problem using the computer processor.

A method of factoring an N-bit integer p as a product of a pair of integers a and b may be summarized as representing a, b, and p in binary using a computer processor; constructing a logic circuit which performs the multiplication of a and b using the computer processor; encoding the logic circuit as a discrete optimization problem using the computer processor; and solving the discrete optimization problem using a quantum processor, wherein solving the discrete optimization problem requires that a logic circuit output gives the binary representation of p.

A method of factoring an N-bit integer p as a product of a pair of integers a and b may be summarized as representing a, b, and p in binary using a computer processor; constructing a logic circuit which performs the multiplication of a and b using the computer processor, wherein the logic circuit includes a plurality of logic gates; encoding the logic circuit as a discrete optimization problem using the computer processor, wherein the discrete optimization problem includes a set of miniature optimization problems, and wherein each miniature optimization problem encodes a respective logic gate from the logic circuit, and wherein each respective miniature optimization problem is characterized by a respective objective function that is minimized when a truth table of the corresponding logic gate is obeyed; and solving the discrete optimization problem using a quantum processor, wherein solving the discrete optimization problem requires that a logic circuit output gives the binary representation of p.

A method of performing a quantum annealing operation using a quantum processor comprising a first set of qubits and at least a second set of qubits may be summarized as clamping a respective state of each qubit in the first set of qubits by applying a control signal to each qubit in the first set of qubits; and evolving a respective state of each qubit in the second set of qubits by applying a first dynamic annealing signal to each qubit in the second set of qubits, wherein the control signal that is applied to each qubit in the first set of qubits is evolved to compensate for a change induced in each qubit in the first set of qubits by a coupling to the first dynamic annealing signal that is applied to each qubit in the second set of qubits. Applying a first dynamic annealing signal to each qubit in the second set of qubits may include applying the first dynamic annealing signal at a maximum value at a beginning of the quantum annealing operation and gradually reducing the first dynamic annealing signal to a minimum value by an end of the quantum annealing operation. Applying a control signal to each qubit in the first set of qubits may include applying a substantially fixed static control signal to each qubit in the first set of qubits. In some embodiments, the quantum processor may include a third set of qubits and the method may include applying a second dynamic annealing signal to each qubit in the third set of qubits, wherein the first and second dynamic annealing signals are controlled independently from one another.

A quantum processor may be summarized as including a first set of qubits; a first annealing signal line that is configured to communicably couple to a first dynamic annealing signal to each qubit in the first set of qubits; a second set of qubits; and a second annealing signal line that is configured to communicably couple a second dynamic annealing signal to each qubit in the second set of qubits, wherein at least one qubit in the first set of qubits is configured to communicably couple to at least one qubit in the second set of qubits. In some embodiments, the quantum processor may include a third set of qubits and a third annealing signal line that is configured to communicably couple a third dynamic annealing signal to each qubit in the third set of qubits, wherein at least one qubit in the third set of qubits is configured to communicably couple to at least one qubit in the second set of qubits.

A method of solving a problem may be summarized as generating, using a computer processor, a logic circuit representation of the problem, wherein the logic circuit representation includes a set of logic gates; encoding, using the computer processor, each logic gate from the logic circuit representation as a respective miniature optimization problem, wherein each respective miniature optimization problem is characterized by a respective objective function that is minimized when a truth table of the corresponding logic gate is obeyed; mapping each miniature optimization problem to a respective subset of qubits and coupling devices in a quantum processor; and solving each miniature optimization problem using the quantum processor. Solving each miniature optimization problem using the quantum processor may include initializing the quantum processor in a first configuration described by a first Hamiltonian and evolving the quantum processor to a second configuration described by a second Hamiltonian, and wherein the second Hamiltonian includes a plurality of $h_i$ terms and a plurality of $J_{ij}$ terms. Mapping each miniature optimization problem to a respective subset of qubits and coupling devices in a quantum processor may include programming the $h_i$ and $J_{ij}$ terms of the second Hamiltonian to encode each miniature optimization problem. In some embodiments, each logic gate may include at least one intermediate logical input and at least one intermediate logical output, and solving each miniature optimization problem may include clamping a value of at least one of an intermediate logical input and an intermediate logical output.

A method of solving a problem may be summarized as generating a logic circuit representation of the problem using a first computer processor, wherein the logic circuit representation includes at least one logical input, at least one logical output, a first logic gate, and at least a second logic gate, and wherein the first logic gate has at least one intermediate logical input and at least a first intermediate logical output, the second logic gate has at least a first intermediate logical input, and the first intermediate logical output of the first logic gate corresponds to the first intermediate logical input of the second logic gate; encoding the logic circuit representation as a discrete optimization problem using the first computer processor; mapping the discrete optimization problem to a second computer processor; configuring the second computer processor to clamp the first intermediate logical output of the first logic gate; and solving the discrete optimization problem by using the second computer processor to determine at least one intermediate logical input to the first logic gate that corresponds to the clamped first intermediate logical output. In some embodiments, encoding the logic circuit representation as a discrete optimization problem may include encoding the first logic gate as a first miniature optimization problem and at least the second logic gate as a second miniature optimization problem, wherein the first miniature optimization problem is characterized by a first objective function that is minimized when a truth table of the first logic gate is obeyed and the second miniature optimization problem is characterized by a second objective function that is minimized when a truth table of the second logic gate is obeyed, and mapping the discrete optimization problem to a second computer processor may include mapping both the first miniature optimization problem and the second miniature optimization problem to the second computer processor.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1A:
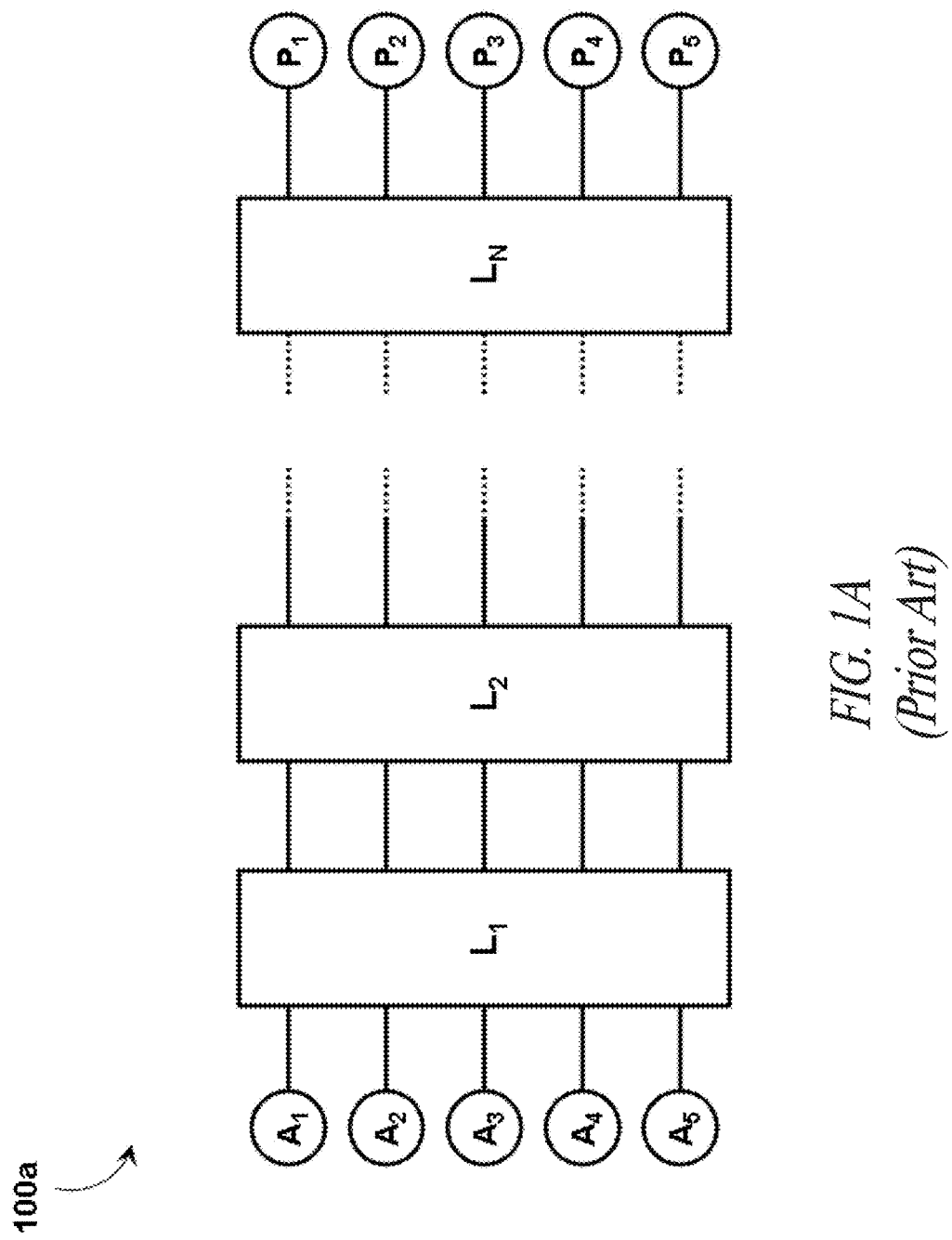
FIG. 1A is a functional diagram of an exemplary logic circuit.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments of the present systems and methods. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems and methods for solving computational problems. These systems and methods introduce a technique whereby a logic circuit representation of a computational problem is encoded as a discrete optimization problem, such as a QUBO, and this discrete optimization problem is then solved using a computer processor, such as a quantum processor. In some embodiments, the quantum processor may be specifically adapted to facilitate solving such discrete optimization problems by enabling the simultaneous control of multiple annealing schedules.

Throughout this specification and the appended claims, reference is often made to a "logic circuit representation of a computational problem." As previously described, a logic circuit may incorporate a set of logical inputs, a set of logical outputs, and a set of logic gates (e.g., NAND gates, XOR gates, and the like) that transform the logical inputs to the logical outputs through a set of intermediate logical inputs and intermediate logical outputs. A complete logic circuit may include a representation of the input(s) to the computational problem, a representation of the output(s) of the computational problem, and a representation of the sequence of intermediate steps in between the input(s) and the output(s). Thus, for the purposes of the present systems and methods, the computational problem is defined by its input(s), its output(s), and the intermediate steps that transform the input(s) to the output(s) and a "logic circuit representation of the computational problem" accordingly may include all of these elements.

In some embodiments, the structure of a logic circuit stratifies into layers. For example, the logical input(s) may represent a first layer, each sequential logical (or arithmetic) operation may represent a respective additional layer, and the logical output(s) may represent another layer. As previously described, a logical operation may be executed by a single logic gate or by a combination of logic gates, depending on the specific logical operation being executed. Thus, a "layer" in a logic circuit may include a single logic gate or a combination of logic gates depending on the particular logic circuit being implemented.

FIG. 1A shows a functional diagram of an exemplary logic circuit 100a. Logic circuit 100a may embody a logic circuit representation of a computational problem and includes a set of five inputs $A_1$-$A_5$ that are transformed to a set of five outputs $P_1$-$P_5$ through a set of N layers $L_1$-$L_N$. Those of skill in the art will appreciate that alternative embodiments of logic circuits may include any number of inputs and any number of outputs (e.g., X inputs and Y outputs, where X may or may not be equal to Y) connected through any number of layers and/or logic gates. Furthermore, the number of outputs from any given layer may be different from the number of inputs to that layer, and while layers $L_1$-$L_N$ are all connected in series in logic circuit 100a, alternative logic circuits may include layers and/or logic gates that are connected in parallel.

Logic circuit 100a includes a set of five outputs $P_1$-$P_5$ which together may represent a solution to a computational problem. However, for some problems the desired output(s) may already be known, or be restricted to satisfy some known criteria. In such instances, the logic circuit may include an additional component which assesses whether the solution represented by the logic states $P_1$-$P_5$ is acceptable. The additional component may then provide a single output which is TRUE if the solution is acceptable and FALSE if the solution is not acceptable. This is an example of a Boolean circuit.

Figure 1B:
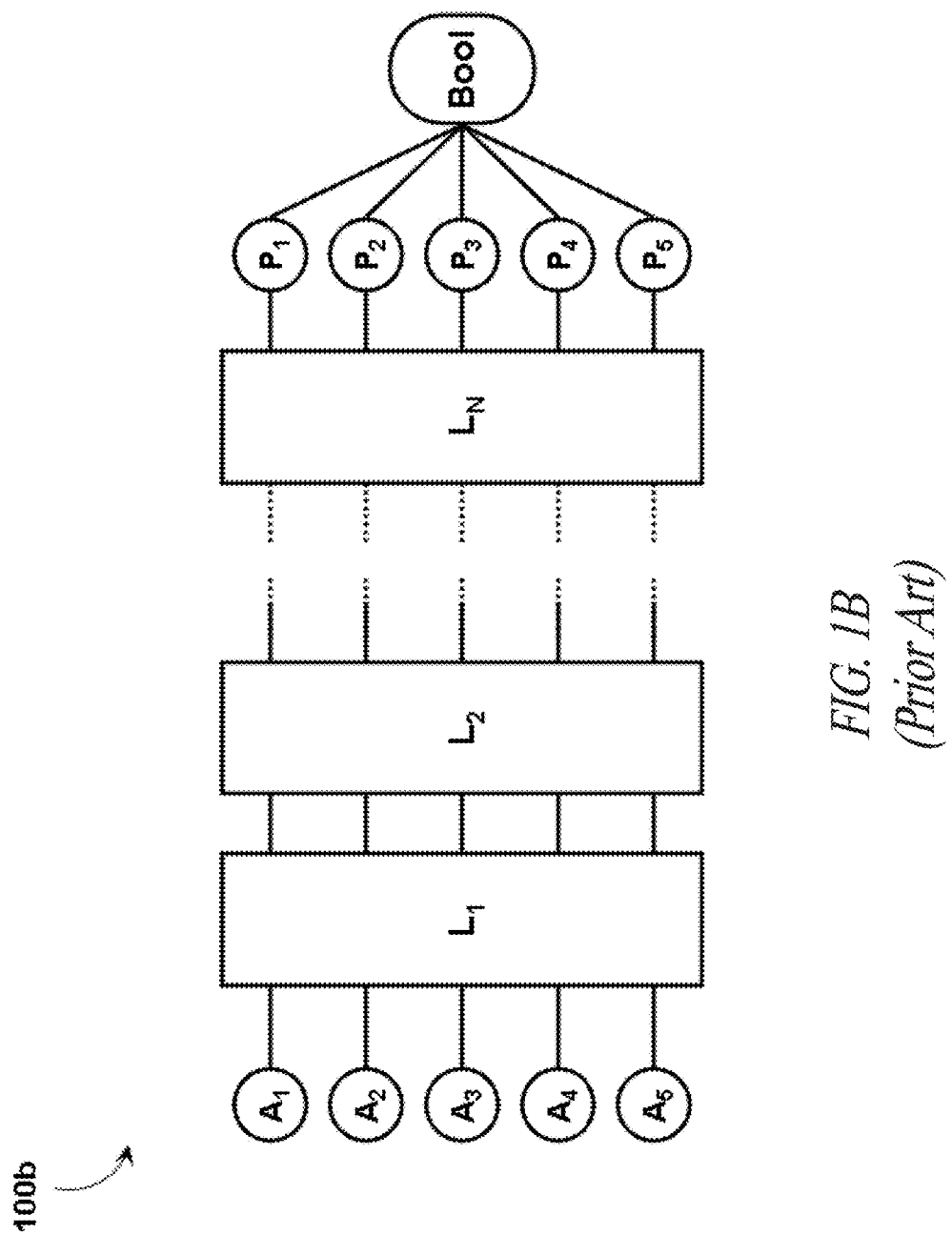
FIG. 1B is a functional diagram of an exemplary Boolean circuit.

FIG. 1B shows a functional diagram of an exemplary Boolean circuit 100b. Boolean circuit 100b is similar to logic circuit 100a from FIG. 1A, except that Boolean circuit 100b is adapted to provide a single Boolean output Bool from intermediate logical outputs $P_1$-$P_5$. If intermediate logical outputs $P_1$-$P_5$ represent an acceptable solution, then the single output Bool is TRUE; otherwise, the single output Bool is FALSE.

The present systems and methods introduce novel techniques for solving computational problems by encoding a logic circuit representation of the original computational problem as a discrete optimization problem. Solving the discrete optimization problem then effectively executes the logic circuit to solve the original computational problem. The methods described herein may be implemented using any form of computer processor; however, the discrete optimization problems that generally result from this approach are very hard and often cannot be solved using known classical solvers. These discrete optimization problems are particularly well-suited to be solved using a quantum processor, or more generally a computer processor that harnesses quantum effects to achieve computation. In some embodiments, the discrete optimization problem is cast as a QUBO problem (where energy minimization is sought) by configuring the qubits and couplers in a quantum processor (e.g., defining the problem Hamiltonian in an implementation of quantum annealing) such that there is a positive energy penalty introduced when a particular combination of intermediate input(s) and intermediate output(s) of a logic gate violates the truth table of the gate. For example, an AND gate having two intermediate inputs $x_1$ and $x_2$ and one intermediate output z may be represented by an objective function such as:

$$H_{AND}(x_1,x_2;z)=x_1x_2-2(x_1+x_2)z+3z$$

where the function is minimized (i.e., $H_{AND}=0$) when the parameters $x_1$, $x_2$, and z are set such that the truth table of the AND gate is obeyed and a positive energy penalty is introduced (e.g., H>0) when the truth table of the AND gate is violated. In the case of an AND gate, this means that $H_{AND}(0, 0, 0)=H_{AND}(0, 1, 0)=H_{AND}(1, 0, 0)=H_{AND}(1, 1, 1)=0$, and $H_{AND}(x_1, x_2; z)>0$ for all other combinations of $x_1$, $x_2$, and z. Similarly, the OR gate may, for example, be represented by an objective function such as:

$$H_{OR}(x_1,x_2;z)=H_{AND}(1-x_1,1-x_2;1-z)$$

and the NOT gate may, for example, be represented by an objective function such as:

$$H_{NOT}(x;z)=2xz-x-z+1$$

From the above, those of skill in the art will appreciate how a similar objective function may be defined for any logic gate. Thus, in some embodiments, the QUBO problem representing a logic circuit is essentially comprised of a plurality of miniature optimization problems, where each gate in the logic circuit corresponds to a particular miniature optimization problem. Each miniature optimization problem is minimized (i.e., solved) when the inputs $x_1$, $x_2$ and the output z are set such that the truth table of the particular gate to which the miniature optimization problem corresponds is obeyed. In some embodiments, the values of the inputs $x_1$, $x_2$ and the output z may each correspond to the value (i.e., state) of a respective qubit in a quantum processor.

Figure 2A:
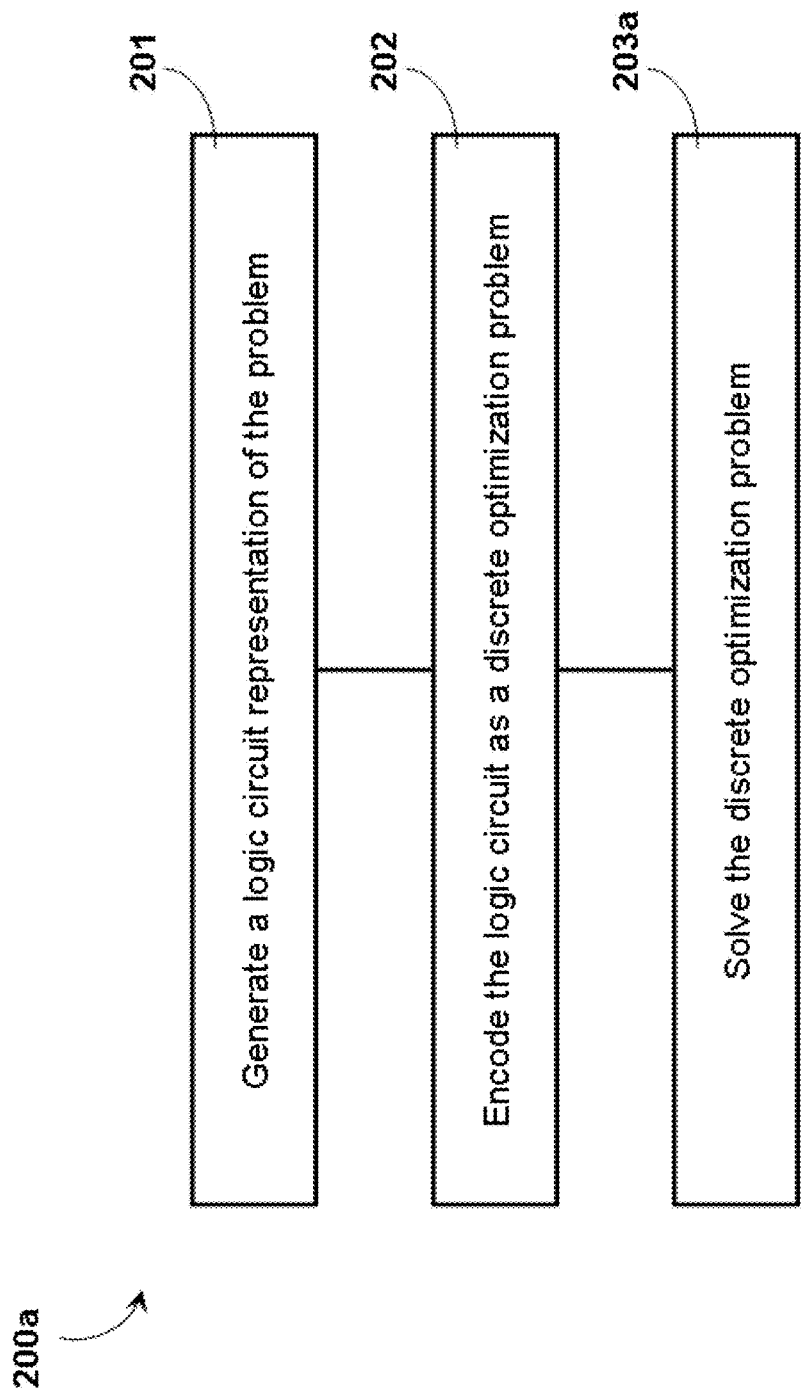
FIG. 2A is a flow-diagram of an embodiment of a method for solving a computational problem in accordance with the present systems and methods.

FIG. 2A shows a flow diagram of an embodiment of a method 200a for solving a computational problem in accordance with the present systems and methods. Method 200a includes three acts 201-203a, though those of skill in the art will appreciate that alternative embodiments may omit certain acts and/or include additional acts. At 201, a logic circuit representation of the computational problem is generated. Exemplary logic circuit representations are described in FIGS. 1A and 1B and these may be generated using systems and methods that are known in the art. For example, a logic circuit representation of the computational problem may be generated using a classical digital computer processor. In this case, the logic circuit representation of the computational problem may be stored in at least one computer- or processor-readable storage medium, such as a computer-readable non-transitory storage medium or memory (e.g., volatile or non-volatile). For computational problems of the class NP, the logic circuit representation will typically be polynomially-sized. At 202, the logic circuit representation of the computational problem is encoded as a discrete optimization problem. This encoding may be achieved, for example, using a classical digital computer processor. In this case, the discrete optimization problem may be stored in at least one computer- or processor-readable storage medium, such as a computer-readable non-transitory storage medium or memory (e.g., volatile or non-volatile). In some embodiments, the logic circuit may be encoded as an optimization objective, or a set of optimization objectives, so that bit strings which satisfy the logic circuit have energy of zero and all other bit strings have energy greater than zero. At 203a, the discrete optimization problem is solved, thereby establishing a solution to the original computational problem. In some embodiments, the discrete optimization problem may be solved using a computer processor, such as a quantum processor. Solving the discrete optimization problem may then involve, for example, evolving the quantum processor to the configuration that minimizes the energy of the system in order to establish a bit string that satisfies the optimization objective(s).

In some embodiments, encoding the logic circuit as a discrete optimization problem at 202 of method 200a enables a particular approach to solving the discrete optimization problem at 203a. This approach is described in FIG. 2B.

Figure 2B:
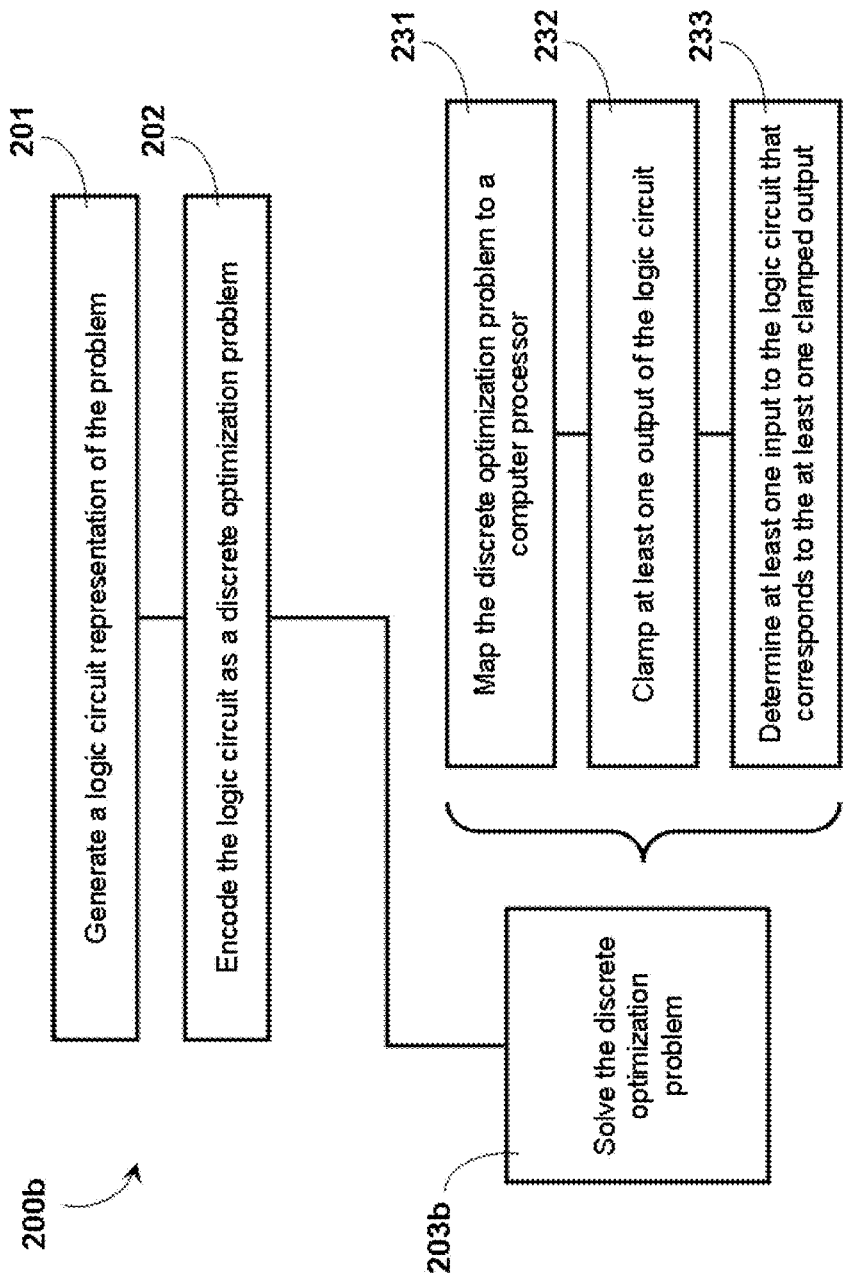
FIG. 2B is a flow-diagram of an embodiment of another method for solving a computational problem in accordance with the present systems and methods.

FIG. 2B shows a flow-diagram of an embodiment of a method 200b for solving a computational problem in accordance with the present systems and methods. Method 200b is similar to method 200a from FIG. 2A and includes three main acts 201-203b. Acts 201-203b of method 200b are the same, respectively, as acts 201-203a of method 200a, except that in method 200b act 203b is further broken down to include three acts 231-233. That is, in some embodiments the act of solving the discrete optimization problem 203b may itself include three acts 231-233. At 231, the discrete optimization problem is mapped to a computer processor. In some embodiments, the computer processor may include a quantum processor and mapping the discrete optimization problem to the computer processor may include programming the elements (e.g., qubits and couplers) of the quantum processor. Mapping the discrete optimization problem to the computer processor may include the discrete optimization problem in at least one computer or processor-readable storage medium, such as a computer-readable non-transitory storage medium or memory (e.g., volatile or non-volatile). At 232, at least one logical output is clamped. Throughout this specification and the appended claims, the term "clamped" is used to describe a variable that is held substantially fixed while the discrete optimization problem is solved, thereby forcing all of the other variables to adjust to accommodate the substantially fixed variable. Thus, to "clamp" an output means to program that output such that its state remains substantially fixed while the discrete optimization problem is solved. In the exemplary objective function defining the AND gate $H_{AND}(x_1, x_2; z)$ given above, clamping the output means substantially fixing the value of z. In an application of quantum annealing, the qubit corresponding to output z may be programmed to maintain a substantially fixed state while the qubits corresponding to inputs $x_1$ and $x_2$ may be evolved to determine respective states which minimize the objective function $H_{AND}$, where the objective function $H_{AND}$ is encoded, at least in part, by the programmable couplings between the qubits representing the $x_1$, $x_2$, and z variables. For act 232, the at least one logical output that is clamped may be an output of the complete logic circuit representation, or it may be an intermediate logical output of a particular logical operation and/or a particular logic gate. At 233, the discrete optimization problem is solved by determining at least one logical input to the logic circuit that corresponds to the at least one clamped output.

In traditional problem-solving methods, the inputs to the problem are effectively clamped because they generally remain fixed for a given problem instance while the corresponding outputs are determined. However, in some embodiments of the present systems and methods it is the outputs of the problem (or the intermediate output(s) of a particular logical operation and/or logic gate) that are clamped so that solving the discrete optimization problem involves determining the inputs that correspond to the clamped outputs. Thus, some embodiments of the present systems and methods describe problem-solving techniques in which a logic circuit representation of the problem is established and then the logic circuit is effectively executed in reverse, or in an undirected fashion, to determine which inputs correspond to a given set of outputs. This problem-solving approach is illustrated in FIGS. 3A and 3B.

Figure 3A:
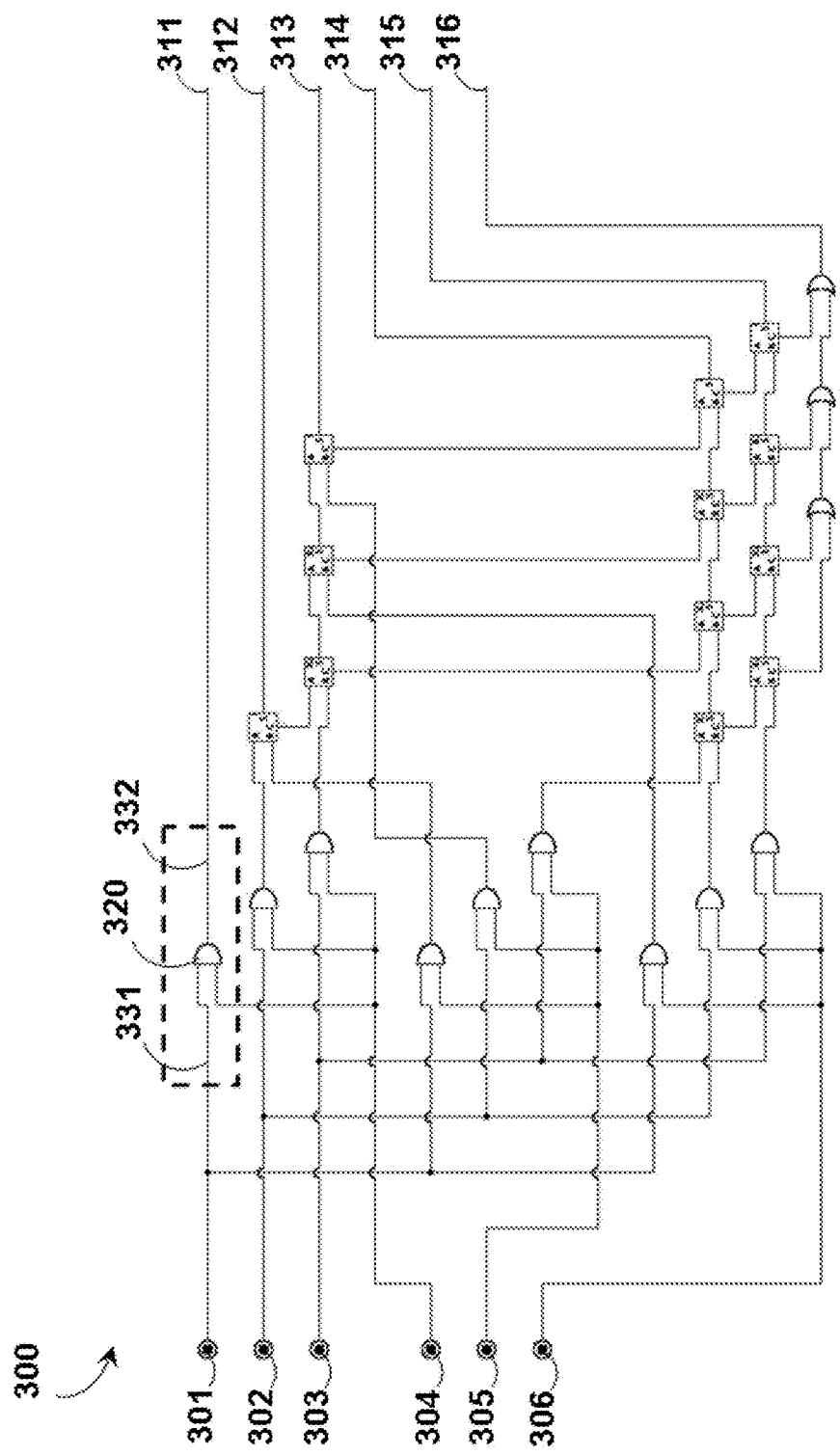
FIG. 3A is a schematic diagram of an embodiment of a logic circuit representation of a computational problem in accordance with the present systems and methods.

FIG. 3A is a schematic diagram of a logic circuit representation 300 of a computational problem. Circuit 300 includes a set of six logical inputs 301-306 and six logical outputs 311-316, though those of skill in the art will appreciate that an alternative logic circuit may incorporate any number of logical inputs and any number of logical outputs. Logical inputs 301-306 are transformed to logical outputs 311-316 through a plurality of logic gates 320 (only one called out in the Figure to reduce clutter). Each logic gate 320 has a corresponding set of at least one intermediate logical input 331 (only one called out in the Figure) and at least one intermediate logical output 332 (only one called out in the Figure). In some instances (as is the case for the specific logic gate labeled as 320), an intermediate logical input (e.g., 331) may correspond to an input (e.g., 301) to the complete circuit 300 and/or an intermediate logical output (e.g., 332) may correspond to an output (e.g., 311) from the complete circuit 300. Circuit 300 represents an embodiment of the general method 200a described in FIG. 2A. In accordance with the present systems and methods, circuit 300 may be mapped to a discrete optimization problem, such as a QUBO problem, which may then be stored and operated on in at least one computer or processor-readable storage medium, such as a computer-readable non-transitory storage medium or memory (e.g., volatile or non-volatile).

Figure 3B:
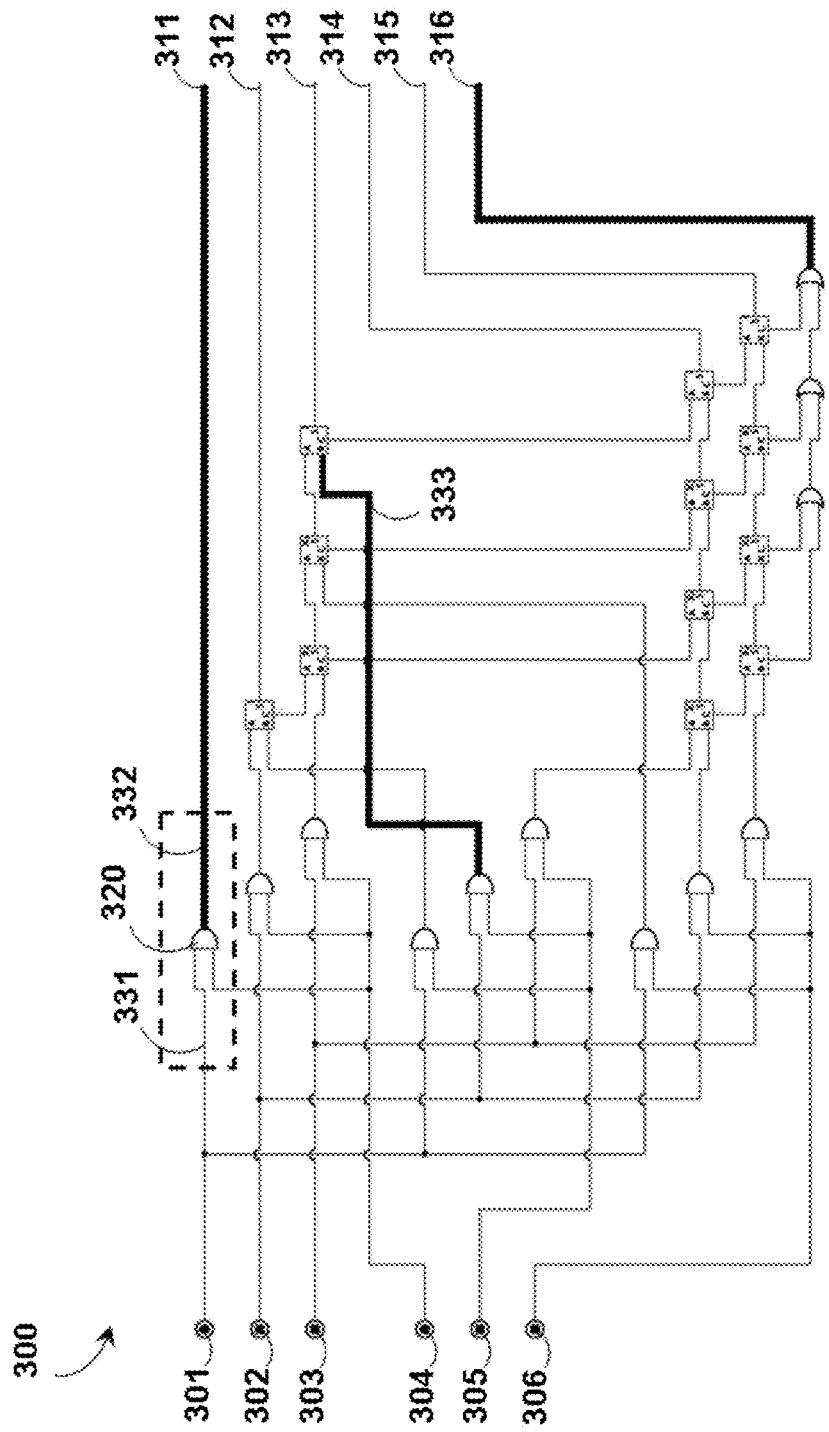
FIG. 3B is a schematic diagram of the same embodiment of a logic circuit representation as depicted in FIG. 3A, only FIG. 3B further illustrates the clamping of specific logical outputs in accordance with the present systems and methods.

FIG. 3B is a schematic diagram of the same logic circuit representation 300 as depicted in FIG. 3A, only FIG. 3B further illustrates the clamping of specific logical outputs. In FIG. 3B, logical outputs 311 and 316, as well as intermediate logical output 333, have all been clamped—meaning that each has been fixed in a specific state (i.e., either 1 or 0). This clamping is illustrated by thickening of the lines corresponding to outputs 311, 316, and 333. Depending on the application, simultaneously clamped outputs (e.g., 311, 316, and 333) may be clamped in the same state (e.g., 0) or they may each be clamped in any state (e.g., any combination of 0s and 1s). While FIG. 3A represents an embodiment of general method 200a from FIG. 2A, FIG. 3B is an embodiment of method 200b from FIG. 2B. Thus, in solving logic circuit 300 with clamped variables 311, 316, and 333 as illustrated in FIG. 3B, a configuration having a set of inputs 301-306 and remaining outputs 312-315 that correspond to the clamped variables 311, 316 and 333 is determined. A particularly useful application of this technique is the case where the logic circuit representation of the computational problem is a Boolean circuit designed, for example, to verify a solution to the computational problem.

Figure 4:
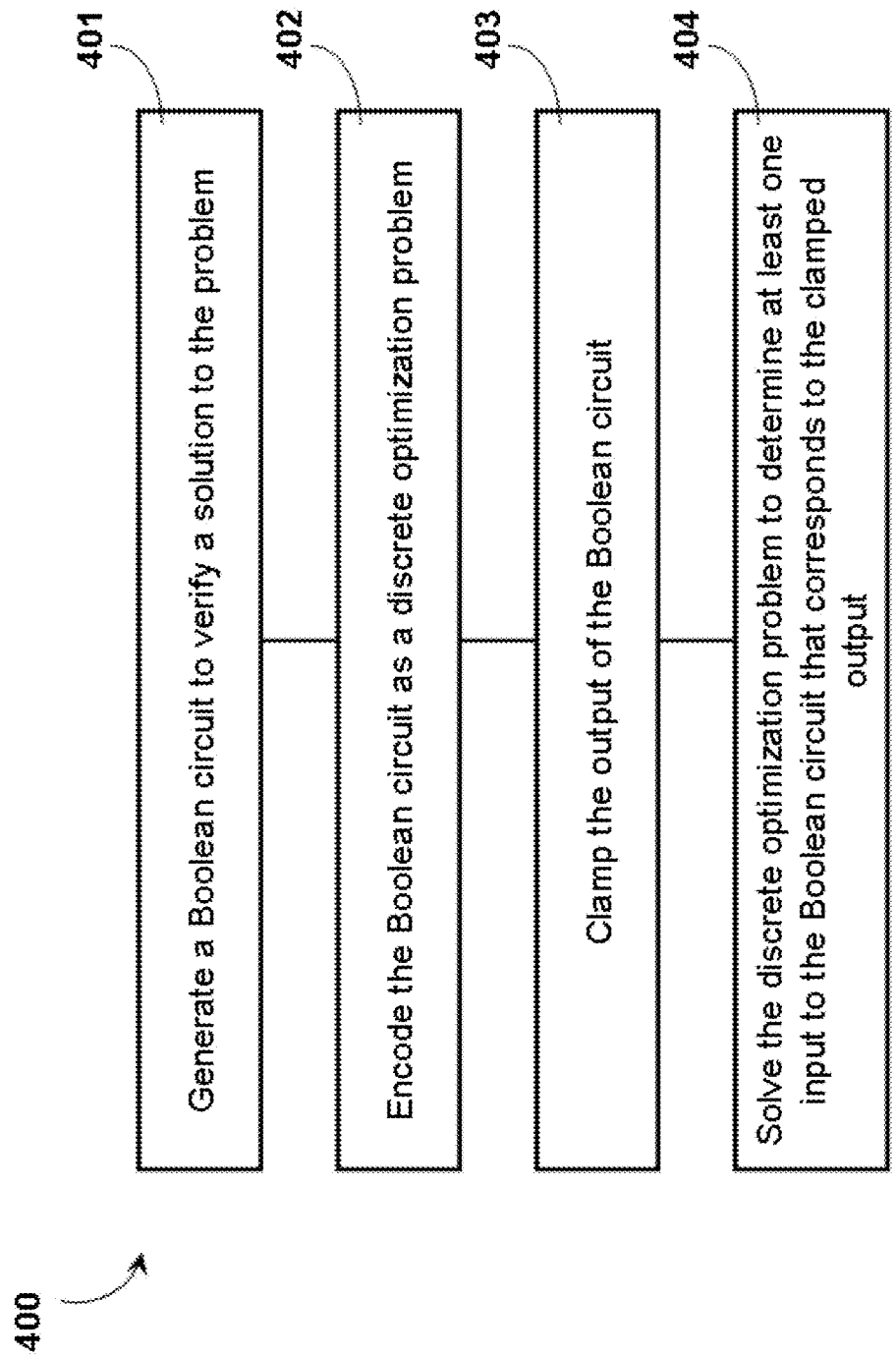
FIG. 4 is a flow-diagram of an embodiment of yet another method for solving a computational problem in accordance with the present systems and methods.

FIG. 4 shows a flow-diagram of an embodiment of a method 400 for solving a computational problem in accordance with the present systems and methods. Method 400 includes four acts 401-404, though those of skill in the art will appreciate that alternative embodiments may omit certain acts and/or include additional acts. At 401, a Boolean circuit that verifies a solution to the computational problem is generated. A Boolean circuit typically has a single output that may be one of two states: either TRUE or FALSE. In some embodiments, the Boolean circuit may test the solution to the computational problem and output TRUE if the solution is acceptable or FALSE is the solution is not acceptable. The Boolean circuit may be generated, for example, using a classical digital computer processor. In this case, the Boolean circuit may be stored in at least one computer or processor-readable storage medium, such as a computer-readable non-transitory storage medium or memory (e.g., volatile or non-volatile). At 402, the Boolean circuit is encoded as a discrete optimization problem in a manner similar to that described for act 202 of methods 200a and 200b. At 403, the output of the Boolean circuit is clamped. Depending on the nature of the problem, the output may be clamped as TRUE or it may be clamped as FALSE. In embodiments that are implemented on a quantum processor, this means that the qubit or qubits that represent the Boolean output are programmed in a substantially fixed state corresponding to either TRUE or FALSE. At 404, the discrete optimization problem is solved to effectively execute the Boolean circuit in reverse and determine at least one input that corresponds to the clamped output. The Boolean circuit may be solved, for example, by an operation of a quantum processor. In this case, the Boolean circuit may be stored and operated on in at least one computer or processor-readable storage medium, such as a computer-readable non-transitory storage medium or memory (e.g., volatile or non-volatile).

An example of an application where it may be desirable to clamp the output of the Boolean circuit as TRUE is factoring. In this case, the Boolean circuit may represent a multiplication circuit corresponding to the factoring problem, and clamping the Boolean output as TRUE enables the inputs (e.g., factors) that correspond to the product to be determined. An example of an application where it may be desirable to clamp the output of the Boolean circuit as FALSE is software verification and validation (also known as software quality control). In this case, the code embodying a piece of software or program may be represented by a Boolean logic circuit, where the output of the circuit (and/or any particular intermediate logical operation and/or logic gate) will be TRUE if the code has no errors (i.e., "bugs"). Clamping the output of the circuit (or intermediate output of a particular logical operation and/or logic gate) as FALSE then determines which inputs, if any, may produce the FALSE output. If such inputs exist, they may be identified as bugs in the code. Those of skill in the art will appreciate that the code embodying a piece of software may typically be stored on a physical medium, such as at least one computer- or processor-readable storage medium and/or a non-transitory storage medium or memory (e.g., volatile or non-volatile).

As previously described, methods 200a, 200b, and 400 are well-suited to be implemented using a quantum processor. Furthermore, these methods are particularly well-suited to be executed using an adiabatic quantum processor and/or a quantum processor that implements quantum annealing. Quantum annealing and/or adiabatic quantum computation may be implemented in a variety of different ways, but the end goal is generally the same: find a low-energy state, such as a ground state, of a system Hamiltonian where the system Hamiltonian encodes a computational problem and the low-energy state represents a solution to the computational problem. Approaches to meeting this goal generally involve evolving the elements of the quantum processor by the application of a dynamic annealing signal. Typically, a single global annealing signal line is coupled to all of the qubits in the quantum processor such that the same dynamic waveform is applied to every qubit. This ensures uniformed timing across the processor and also minimizes the number of physical lines required to evolve the system.

Figure 5:
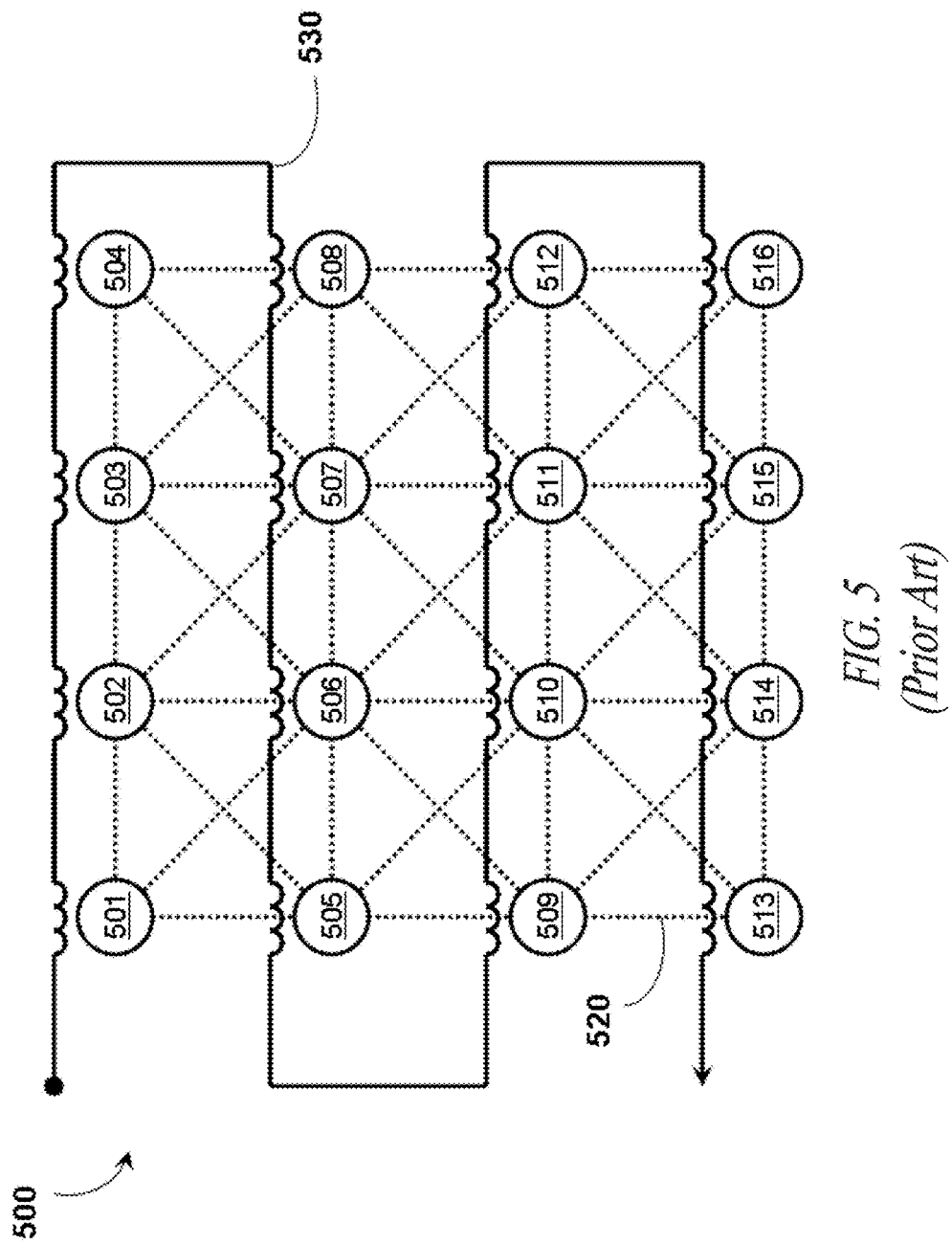
FIG. 5 is a schematic diagram of an exemplary quantum processor implementing a single global annealing signal line.

FIG. 5 shows a schematic diagram of an exemplary quantum processor 500 implementing a single global annealing signal line 530. Quantum processor 500 includes sixteen qubits 501-516 and forty-two couplers 520 (only one called out in the Figure) in a lattice architecture embodying nearest neighbor and next-nearest neighbor coupling. Global annealing signal line 530 is used to couple the same dynamic annealing waveform to each of qubits 501-516. Those of skill in the art will appreciate that the number of qubits and couplers, as well as the nearest neighbor and next-nearest neighbor coupling architecture, in quantum processor 500 are all used for illustrative purposes and that a quantum processor may implement any number of qubits and couplers arranged according to any coupling architecture. Qubits 501-516 and couplers 520 are capable of storing and performing operations on computer-readable information; thus, for the purposes of the present systems and methods, a quantum processor (e.g., 500) includes computer- or processor-readable storage media and/or non-transitory storage media or memory (e.g., volatile or non-volatile).

In some embodiments, the various methods described herein (e.g., methods 200a, 200b, and 400) may be implemented on a quantum processor having a single global annealing signal line, such as quantum processor 500. In other embodiments, however, the various methods described herein may benefit from a quantum processor that includes multiple annealing signal lines each capable of administering a unique dynamic waveform to a respective set of qubits in the processor.

Figure 6:
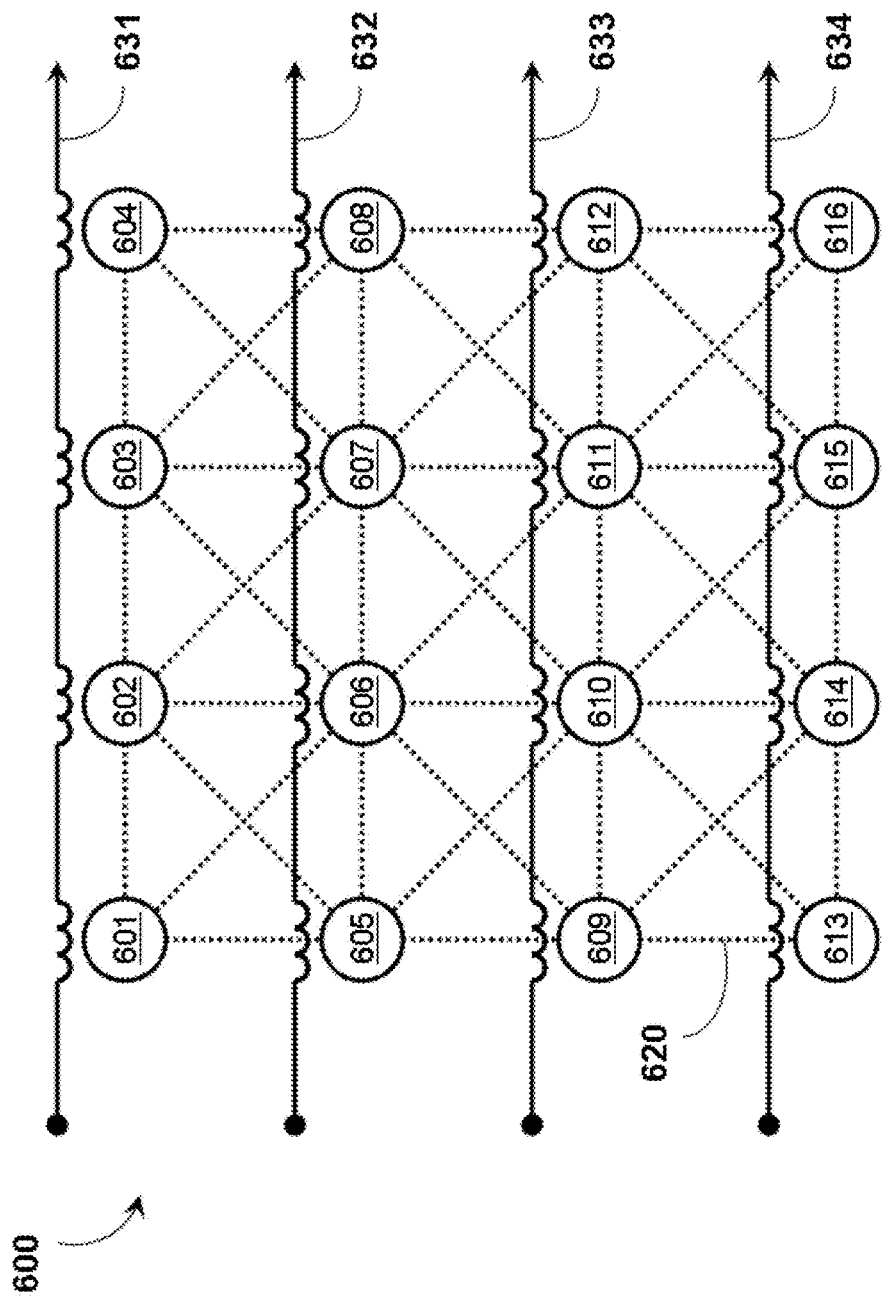
FIG. 6 is a schematic diagram of an embodiment of a quantum processor that incorporates multiple annealing signal lines in accordance with the present systems and methods.

FIG. 6 shows a schematic diagram of an embodiment of a quantum processor 600 that incorporates multiple annealing signal lines 631-634. Quantum processor 600 includes sixteen qubits 601-616 and forty-two couplers 620 (only one called out in the Figure) in a lattice architecture embodying nearest neighbor and next-nearest neighbor coupling. The four global annealing signal lines 631-634 are each arranged to couple a unique dynamic annealing waveform to the qubits in a respective row. Those of skill in the art will appreciate that the number of qubits, couplers, and annealing signal lines, as well as the coupling architecture and the layout of the annealing signal lines in quantum processor 600, are all used for illustrative purposes and that a quantum processor may implement any number of qubits, couplers, and annealing signal lines arranged according to any designer's preferences.

In embodiments in which the structure of a logic circuit (such as the logic circuit representations from methods 200a, 200b, and 400) stratifies into layers (for example, with the logical input(s) representing a first layer, each sequential logical operation representing a respective additional layer, and the logical output(s) representing another layer), each layer may be embodied by a respective set of qubits in the quantum processor. For example, in quantum processor 600 each row of qubits may be programmed to represent a respective layer of a logic circuit. That is, qubits 601-604 may be programmed to represent the inputs to a logic circuit, qubits 605-608 may be programmed to represent a first logical operation (executed by either one or a plurality of logic gates), qubits 609-612 may be programmed to represent a second logical operation (similarly executed by either one or a plurality of logic gates), and qubits 613-616 may be programmed to represent the outputs of the logic circuit. With various sets of qubits representing various layers of the problem, it can be advantageous to enable independent dynamic control of each respective set. For example, if a serial logic circuit (such as logic circuit 100a from FIG. 1A) is mapped to quantum processor 600, then the logical operation represented by qubits 609-612 may receive, as inputs, the outputs of the logical operation represented by qubits 605-608. It follows that the set of qubits 609-612 may advantageously be annealed after the set of qubits 605-608, and therefore a separate dynamic annealing signal line (i.e., lines 633 and 632, respectively) may be necessary to control each of the two sets of qubits.

Those of skill in the art will appreciate that the encoding of a logic circuit representation of a computational problem as a discrete optimization problem, and the subsequent mapping of the discrete optimization problem to a quantum processor, may result in any number of layers involving any number of qubits per layer. Furthermore, such a mapping may implement any scheme of inter-qubit coupling to enable any scheme of inter-layer coupling (i.e., coupling between the qubits of different layers) and intra-layer coupling (i.e., coupling between the qubits within a particular layer). The layout and number of elements presented in quantum processor 600 are used for illustrative purposes only and are in no way intended to limit the present system and methods.

The concept of implementing multiple annealing signal lines has previously been introduced (to facilitate system calibration) in PCT Patent Application Serial No. PCT/US2009/044537 published as PCT Patent Publication 2009-143166, where at least two annealing signal lines are implemented in such a way that no two coupled qubits are both coupled to the same annealing signal line. Conversely, in the present systems and methods it is preferred if the set of qubits that are controlled by a given annealing signal line includes at least two coupled qubits, because the set of qubits that are controlled by a given annealing signal line may correspond to a particular layer of a logic circuit representation and thus there will likely be at least some coupling between the at least two qubits that are in the same layer. However, the implementation of the teachings of PCT Application Serial No. PCT/US2009/044537 published as PCT Patent Publication 2009-143166 does not necessarily exclude the present systems and methods. Since multiple annealing signal lines may be programmed to carry the same annealing signal, any set of qubits that are coupled to the same annealing signal line may similarly be coupled to a pair of interdigitated annealing signal lines.

The application of multiple independently-controlled dynamic annealing signals in accordance with the present systems and methods enables a vastly increased variety and complexity of annealing schedules. This is illustrated in FIGS. 7-9.

Figure 7:
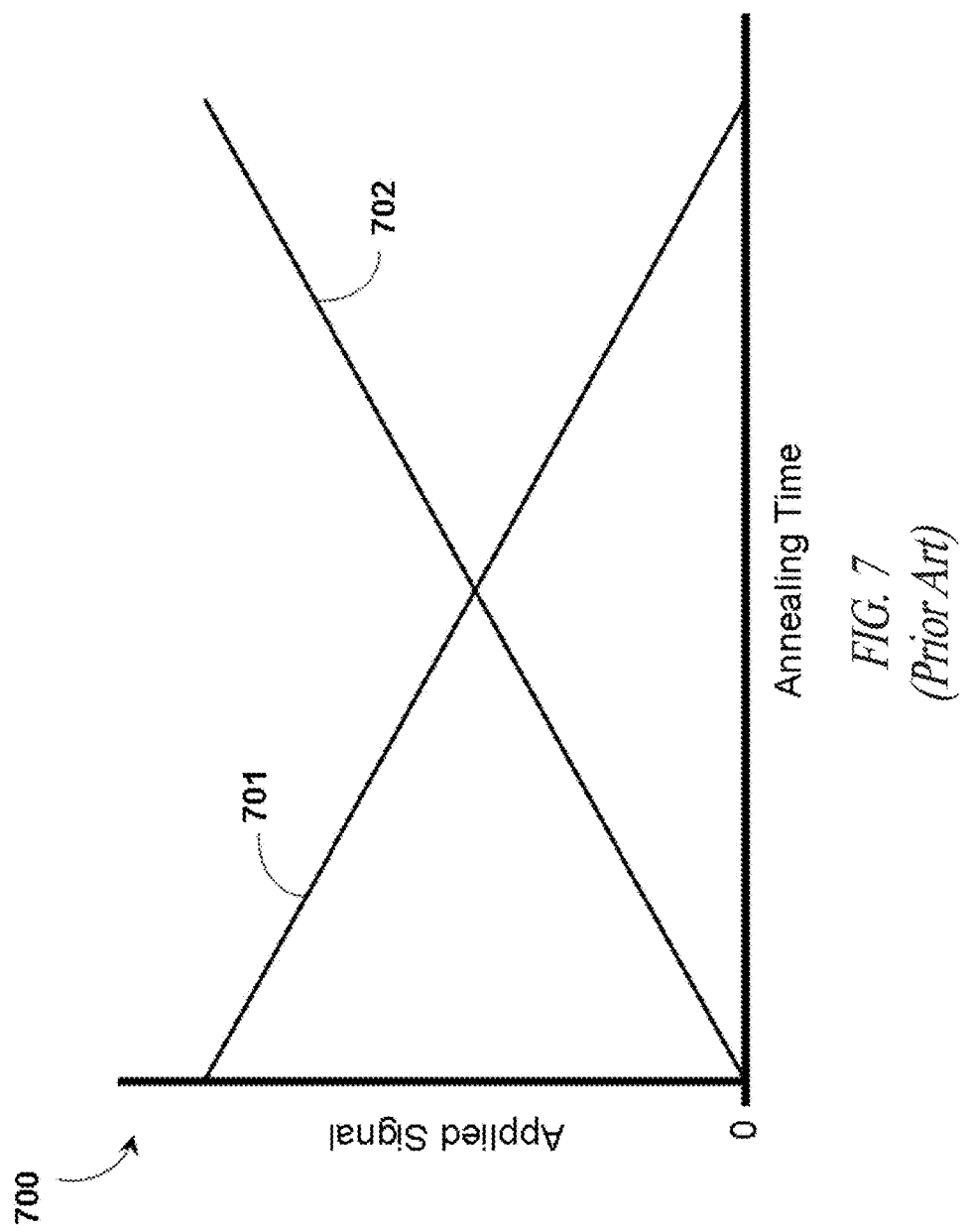
FIG. 7 is an approximate graph showing an exemplary annealing schedule for a system that implements a single global annealing signal line.

FIG. 7 is an approximate graph showing an exemplary annealing schedule 700 for a system that implements a single global annealing signal line. The global annealing signal is represented by line 701 and is typically applied to all qubits in the quantum processor. In this example, the global annealing signal 701 starts at a maximum value and then gradually reduces to a minimum value (e.g., zero) by the end of the schedule. In conjunction with the annealing signal 701, a set of control signals 702 are typically applied to each qubit to contribute at least some of the terms of the problem Hamiltonian. These control signals typically begin at a minimum value (e.g., zero) and, as the annealing signal 701 is ramped down, are typically ramped up to a maximum value by the end of the schedule. Annealing schedule 700 is a common approach for systems that implement only a single global annealing signal line its versatility is limited by the fact that the same dynamic annealing waveform must be applied to all qubits.

Figure 8:
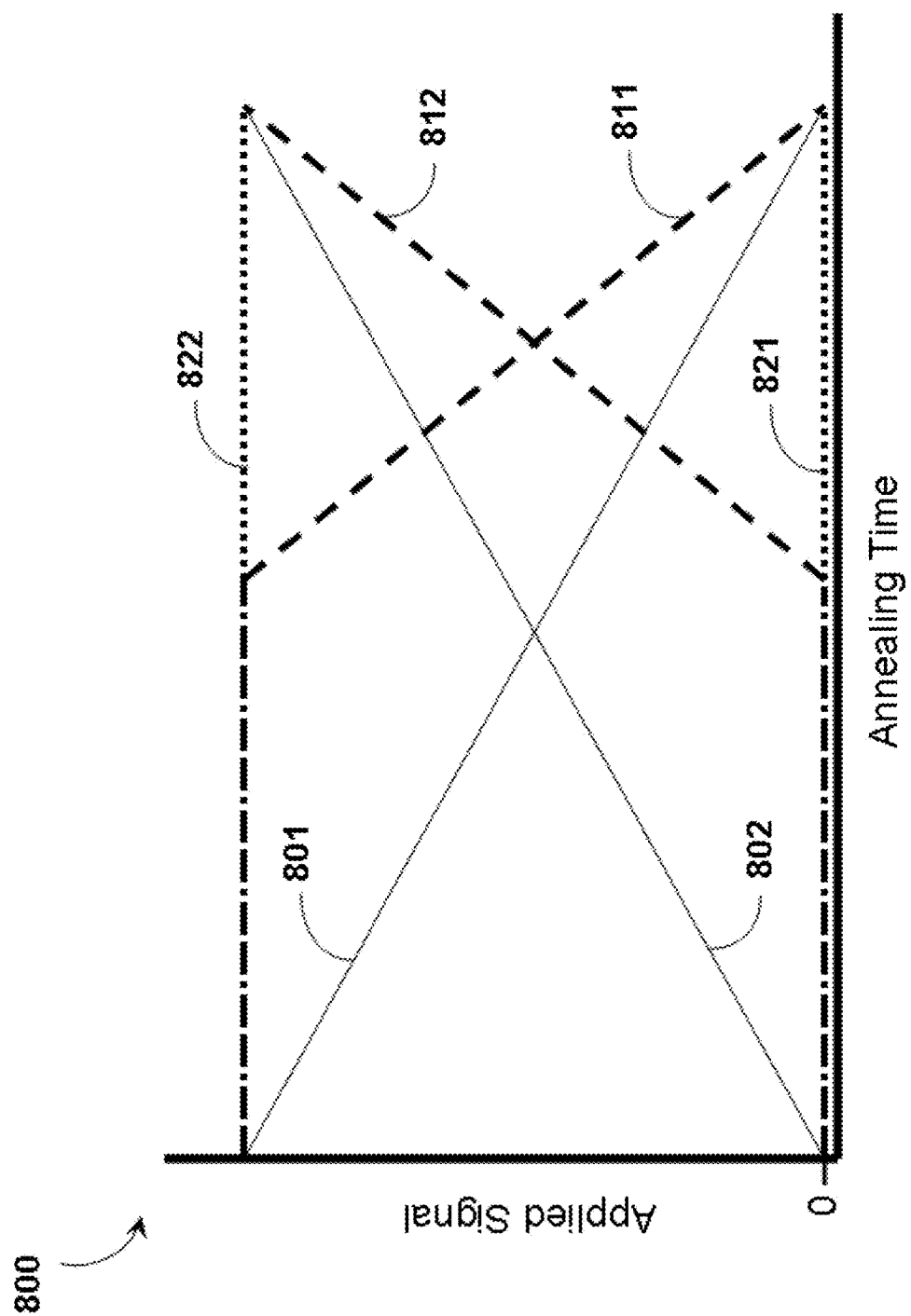
FIG. 8 is an approximate graph showing an exemplary annealing schedule for a system that implements multiple independently-controlled annealing signal lines in accordance with the present systems and methods.
Figure 9:
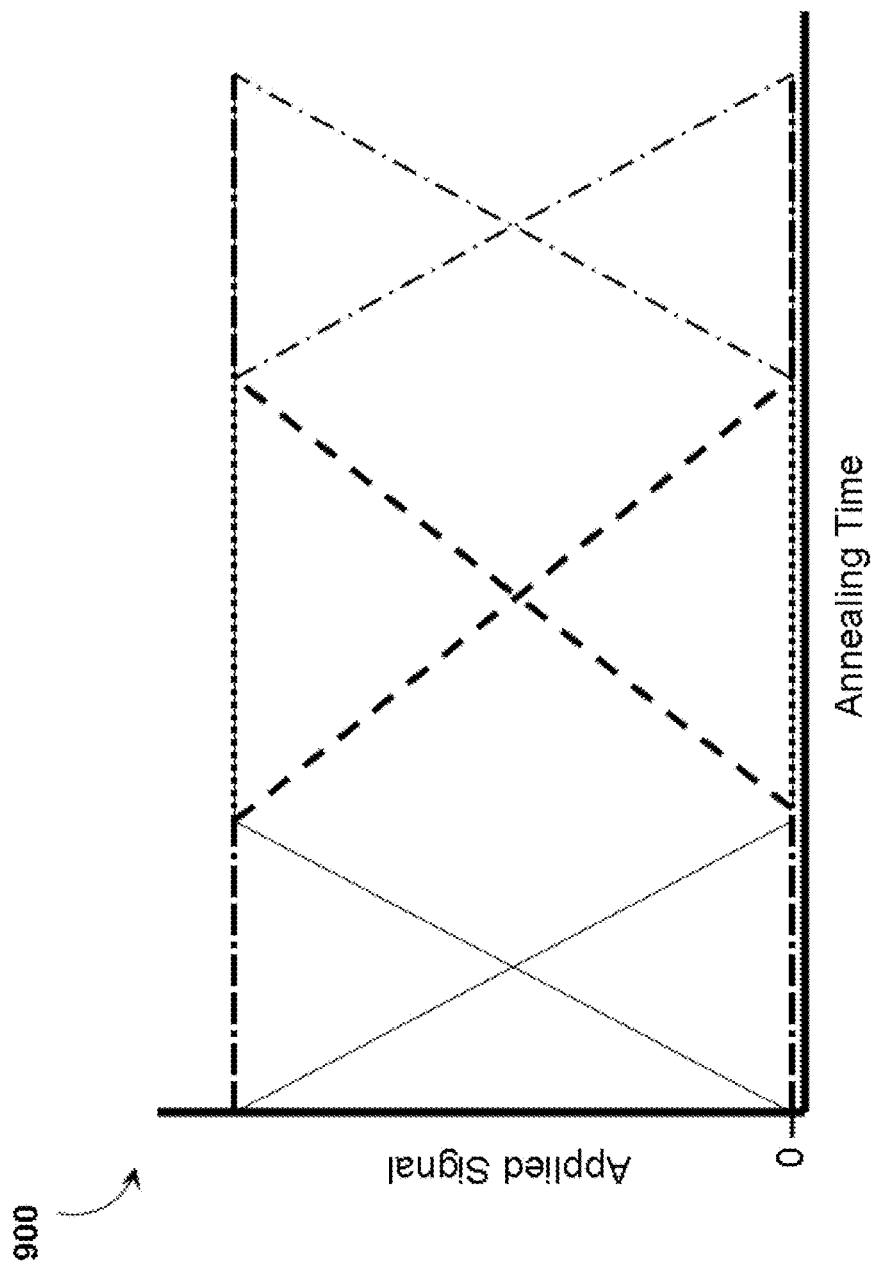
FIG. 9 is another approximate graph showing an exemplary annealing schedule for a system that implements multiple independently-controlled annealing signal lines in accordance with the present systems and methods.

Conversely, FIG. 8 is an approximate graph showing an exemplary annealing schedule 800 for a system that implements multiple (e.g., three) independently-controlled annealing signal lines in accordance with the present systems and methods. The three independently-controlled annealing signal lines are represented by lines 801, 811 and 821 and may each be used to anneal a respective one of three sets of qubits in a quantum processor. Unlike annealing schedule 700 from FIG. 7, the applied annealing signals 801, 811, 821 in schedule 800 each evolve differently over the course of the schedule. This means that over the course of annealing schedule 800 the three sets of qubits are each evolved in a different way. For example, qubits that are annealed by signal 801 evolve steadily from a maximum annealing signal to a minimum annealing signal (e.g., zero) over the course of schedule 800. However, qubits that are annealed by signal 811 are initially exposed to stronger annealing signals for a longer period of time as signal 811 does not begin to ramp down until long after signal 801. Furthermore, qubits that are annealed by signal 821 do not evolve at all because signal 821 remains at zero throughout the duration of schedule 800. Qubits that are annealed by signal 821 represent "clamped" variables and may, in accordance with methods 200b and 400, correspond to at least one output of a logic circuit representation.

The additional signals in schedule 800 (specifically, signals 802, 812, and 822) represent control signals that are respectively applied to the three sets of qubits to contribute at least some of the terms of the problem Hamiltonian. Similar to annealing schedule 700 from FIG. 7, in annealing schedule 800 each control signal 802, 812, 822 mirrors a respective annealing signal 801, 811, 821. That is, signals 801 and 802 respectively provide annealing and control signals to a first set of qubits; signals 811 and 812 respectively provide annealing and control signals to a second set of qubits; and signals 821 and 822 respectively provide annealing and control signals to a third set of qubits. At the end of the schedule, all control signals are applied at maximum value. Because the states of the qubits that are controlled by signal 822 are clamped in this example, signal 822 is applied at maximum value throughout the duration of schedule 800.

Annealing schedule 800 is illustrated herein as an example only, while the present systems and methods provide the versatility to enable many variations of annealing schedules. For example, in some embodiments an annealing signal may evolve in a non-linear manner, at a faster or slower rate than illustrated, and may even oscillate if appropriate. Furthermore, in some embodiments an annealing signal may not be mirrored by a corresponding control signal, or a control signal that mirrors an annealing signal may evolve in a way that does not coincide with the evolution of the corresponding annealing signal. In some embodiments, some annealing signals may complete their evolution before and/or after other annealing signals.

For illustrative purposes, FIG. 9 provides an approximate graph showing an exemplary annealing schedule 900 for a system that implements multiple independently-controlled annealing signal lines in accordance with the present systems and methods. In schedule 900, each respective annealing signal line is paired with a respective control signal line, and the two lines that make up each respective pair are illustrated using a distinguishable line-style. Annealing schedule 900 provides an example of a schedule in which multiple sets of qubits are effectively annealed in series, while the states of the qubits in one set remain clamped.

As illustrated in FIGS. 8 and 9, clamping the state of a qubit may be achieved by applying a static control signal to the qubit and no annealing signal. However, in practice a qubit that is coupled to other qubits in a quantum processor may be influenced by signals from those other qubits. For example, if a first qubit is coupled to a second qubit and an evolving annealing signal is applied to the second qubit then the first qubit may still effectively "see" a portion of that evolving annealing signal through the second qubit and be affected by it. In some embodiments, in order to achieve the desired clamping effect of applying a static control signal to a particular qubit as illustrated by line 822 in FIG. 8, it may be necessary to actually evolve (e.g., vary in magnitude over time) the applied control signal in order to compensate for fluctuations induced by the evolving annealing signal that is applied to another qubit to which the particular qubit is coupled. Thus, "clamping" an output may be achieved by programming a corresponding qubit in a substantially fixed state, but this may necessitate the application of a dynamic clamping signal if the state of the clamped qubit is undesirably evolved by a coupling to an unclamped qubit.

In accordance with some embodiments of the present systems, methods and apparatus, solving a discrete optimization problem (such as a QUBO problem) and/or a constraint satisfaction problem includes an implementation of quantum annealing or adiabatic quantum computation. As previously discussed, a typical adiabatic evolution may be represented by equation 1:

$$H_e = (1-s)H_{In} + sH_f \quad (1)$$

where $H_{In}$ is the initial Hamiltonian, $H_f$ is the final or "problem" Hamiltonian, $H_e$ is the evolution or instantaneous Hamiltonian, and s is the evolution coefficient which controls the rate of evolution. In general, s may vary from 0 to 1 with time t as s(t). A common approach to AQC, described, for example, in Amin, M. H. S., "Effect of local minima on quantum adiabatic optimization", PRL 100, 130503 (2008), is to start with an initial Hamiltonian of the form shown in equation 2:

$$H_{In} = -\frac{1}{2}\sum_{i=1}^{n} \Delta_i \sigma_i^x \quad (2)$$

where n represents the number of qubits, $\sigma_i^x$ is the Pauli x-matrix for the $i^{th}$ qubit and $\Delta_i$ is the single qubit tunnel splitting induced in the $i^{th}$ qubit. Here, the $\sigma_i^x$ terms are examples of "off-diagonal" terms. An initial Hamiltonian of this form may, for example, be evolved to a final Hamiltonian of the form:

$$H_f = -\frac{\varepsilon}{2}\left[\sum_{i=1}^{n} h_i \sigma_i^z + \sum_{i,j=1}^{n} J_{ij} \sigma_i^z \sigma_j^z\right] \quad (3)$$

where n represents the number of qubits, $\sigma_i^z$ is the Pauli z-matrix for the $i^{th}$ qubit, $h_i$ and $J_{i,j}$ are dimensionless local fields coupled into each qubit, and $\varepsilon$ is some characteristic energy scale for $H_f$. Here, the $\sigma_i^z$ and $\sigma_i^z \sigma_j^z$ terms are examples of "diagonal" terms. Throughout this specification and the appended claims, the terms "final Hamiltonian" and "problem Hamiltonian" are used interchangeably. In various embodiments of the present systems and methods, a logic circuit representation is converted to a discrete optimization problem such as a QUBO, and the QUBO is mapped directly to the problem Hamiltonian in the processor hardware. Hamiltonians such as $H_{In}$ and $H_f$ in equations 2 and 3, respectively, may be physically realized in a variety of different ways. A particular example is realized by an implementation of superconducting qubits.

Figure 10:
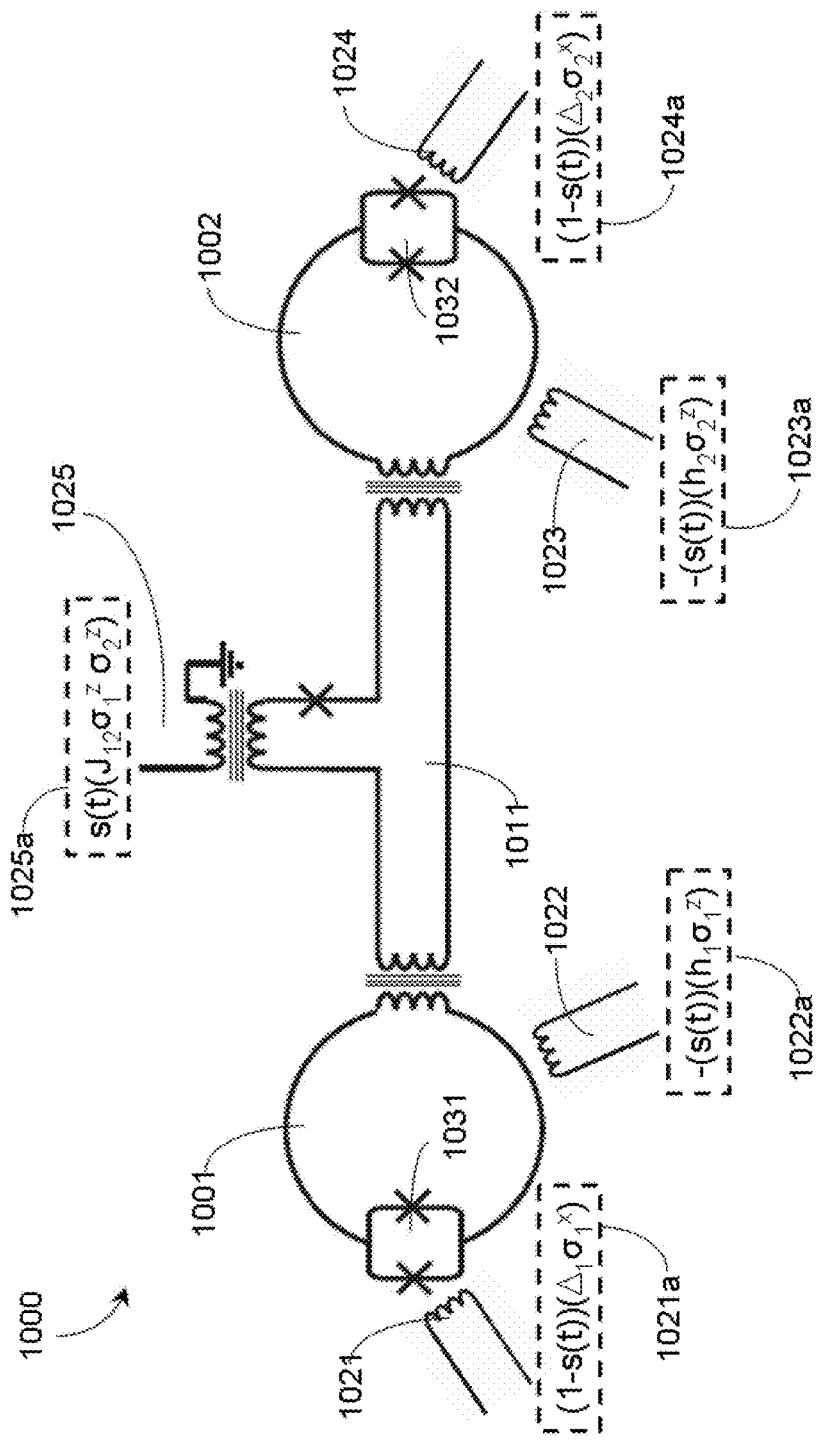
FIG. 10 is a schematic diagram of a portion of a superconducting quantum processor designed for adiabatic quantum computation (and/or quantum annealing).

FIG. 10 is a schematic diagram of a portion of a superconducting quantum processor 1000 designed for AQC (and/or quantum annealing). The portion of superconducting quantum processor 1000 shown in FIG. 10 includes two superconducting qubits 1001, 1002 and a tunable ZZ-coupler 1011 coupling information therebetween. While the portion of quantum processor 1000 shown in FIG. 10 includes only two qubits 1001, 1002 and one coupler 1011, those of skill in the art will appreciate that quantum processor 1000 may include any number of qubits and any number of coupling devices coupling information therebetween.

The portion of quantum processor 1000 shown in FIG. 10 may be implemented to physically realize AQC by initializing the system with the Hamiltonian described by equation 2 and evolving the system to the Hamiltonian described by equation 3 in accordance with the evolution described by equation 1. In various embodiments of the present systems and methods, determining a low energy state, such as the ground state, of the Hamiltonian described by equation 3 may map directly to a QUBO problem, where the QUBO problem encodes a logic circuit representation of a computational problem. This mapping between the QUBO and the problem Hamiltonian is achieved, at least in part, by the programmable assignments to the parameters in the Hamiltonian described by equation 3. Evolving the quantum processor 1000 to determine the ground state of the Hamiltonian described by equation 3 therefore solves the QUBO problem, which effectively executes the logic circuit representation of the computational problem. Quantum processor 1000 includes a plurality of programming interfaces 1021-1025 that are used to configure and control the state of quantum processor 1000. Each of programming interfaces 1021-1025 may be realized by a respective inductive coupling structure, as illustrated, that communicates with a programming system (not shown). Such a programming system may be separate from quantum processor 1000, or it may be included locally (i.e., on-chip with quantum processor 1000) as described in US Patent Publication 2008-0215850.

In the operation of quantum processor 1000, programming interfaces 1021 and 1024 may each be used to couple a flux signal into a respective compound Josephson junction 1031, 1032 of qubits 1001 and 1002, thereby realizing the $\Delta_i$ terms in the system Hamiltonian. This coupling provides the off-diagonal $\sigma^x$ terms of the Hamiltonian described by equation 2 and these flux signals are examples of "disordering signals." Similarly, programming interfaces 1022 and 1023 may each be used to couple a flux signal into a respective qubit loop of qubits 1001 and 1002, thereby realizing the $h_i$ terms in the system Hamiltonian. This coupling provides the diagonal $\sigma^z$ terms of equation 3. Furthermore, programming interface 1025 may be used to couple a flux signal into coupler 1011, thereby realizing the $J_{ij}$ terms in the system Hamiltonian. This coupling provides the diagonal $\sigma_i^z \sigma_j^z$ terms of equation 3. In FIG. 10, the contribution of each of programming interfaces 1021-1025 to the system Hamiltonian is indicated in boxes 1021a-1025a, respectively.

Throughout this specification and the appended claims, the term "quantum processor" is used to generally describe the collection of qubits (e.g., qubits 1001 and 1002) and couplers (e.g., coupler 1011). The qubits 1001 and 1002 and the couplers 1011 are referred to as the "computational elements" of the quantum processor 1000. In the context of a quantum processor, the term "programming subsystem" is used to generally describe the programming elements (e.g., programming interfaces 1022, 1023, and 1025) included in a quantum processor (e.g., processor 1000) and other associated control circuitry or instructions. As previously described, the programming elements of the operational subsystem may communicate with a programming system which may be separate from the quantum processor or included locally on the processor. Similarly, in the context of a quantum processor, the term "evolution subsystem" is used to generally describe the evolution elements 1021, 1024 used to evolve the computational elements of the quantum processor 1000. For example, the evolution subsystem may include annealing signal lines (530, 631-634) and their corresponding interfaces (1021, 1024) to the qubits (1001, 1002).

As previously described, in some embodiments of the present systems and methods, a logic circuit representation of a computational problem may be encoded as a QUBO problem, where the QUBO problem may comprise a plurality of miniature optimization problems. In such embodiments, each miniature optimization problem may encode a particular logic gate in the logic circuit. Each gate in the logic circuit may be characterized by a respective objective function that is mapped to a respective subset of qubits (and associated coupling devices) in a quantum processor, where the objective function is minimized when the truth table of the gate is obeyed. The objective function representing a particular logic gate may be mapped to a subset of qubits and associated coupling devices by accordingly programming the values of the $h_i$ and $J_{ij}$ terms for those qubits and coupling devices. This particular approach to solving computational problems is summarized in method 1100.

Figure 11:
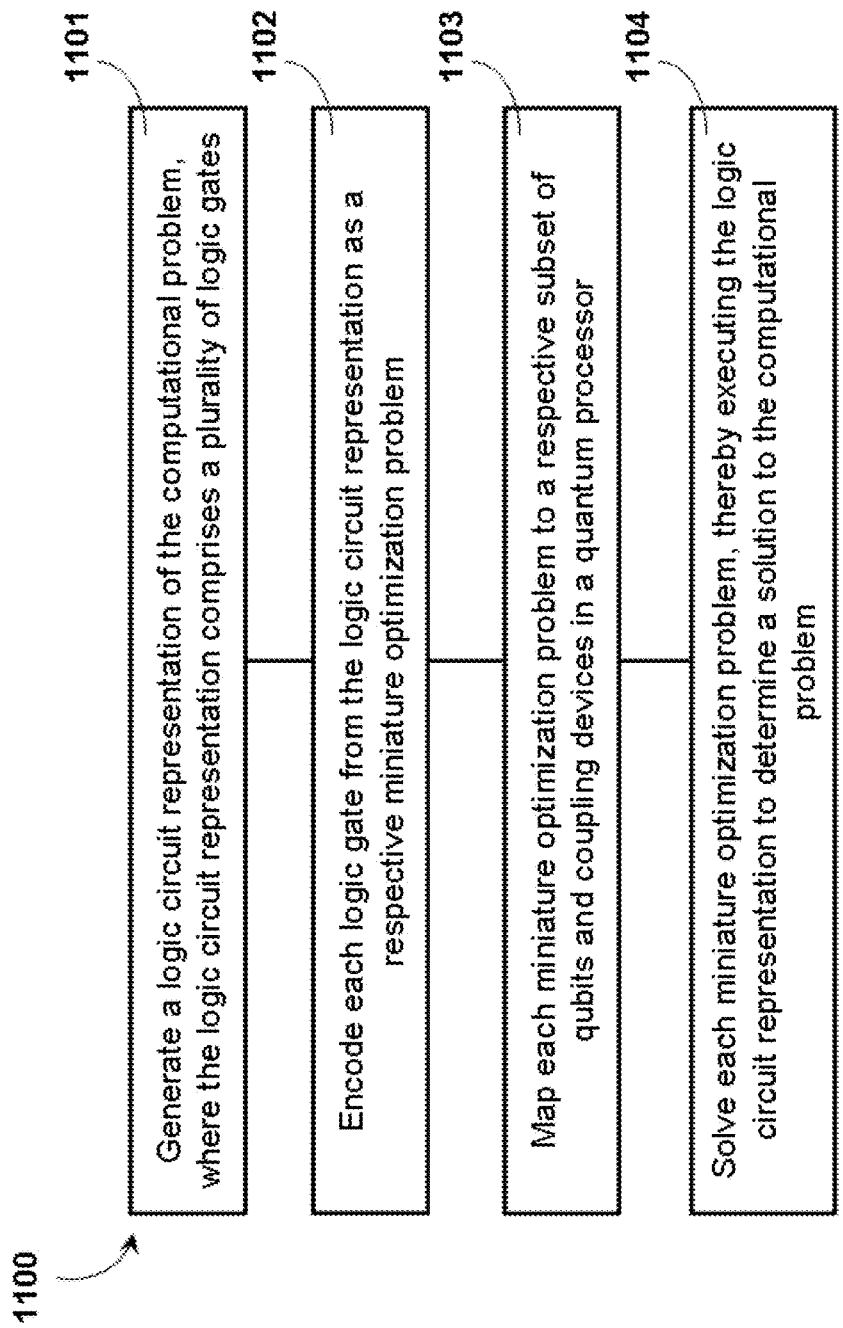
FIG. 11 is a flow-diagram of an embodiment of a method for solving a computational problem in accordance with the present systems and methods.

FIG. 11 shows a flow-diagram of an embodiment of a method 1100 for solving a computational problem in accordance with the present systems and methods. Method 1100 includes four acts 1101-1104, though those of skill in the art will appreciate that alternative embodiments may omit certain acts and/or include additional acts. At 1101, a logic circuit representation of the computational problem is generated, where the logic circuit representation comprises a plurality of logic gates. Exemplary logic circuit representations include those illustrated in FIGS. 1A, 1B, 3A, and 3B. The logic circuit representation of the computational problem may be generated by known techniques using, for example, a classical digital computer processor. At 1102, each logic gate from the logic circuit representation is encoded as a respective miniature optimization problem. In some embodiments, each logic gate may be encoded as a miniature optimization problem using, for example, a classical digital computer processor. Each respective miniature optimization problem may be characterized by a respective objective function that is minimized when the truth table of the corresponding logic gate is obeyed. Exemplary objective functions for the AND, OR, and NOT gates have been described, and from these a person of ordinary skill in the art will appreciate how similar objective functions for other logic gates may be formed. Furthermore, a person of ordinary skill in the art will appreciate that the exemplary objective functions for the AND, OR, and NOT gates provided herein are used for illustrative purposes only and alternative objective functions may be crafted that similarly represent the AND, OR, and NOT gates.

At 1103, each miniature optimization problem is mapped to a respective subset of qubits and coupling devices in a quantum processor. This mapping may be achieved, for example, by programming the $h_i$ and $J_{ij}$ parameters of a subset of qubits and coupling devices to realize the objective function that corresponds to the particular logic gate being mapped. In such a mapping, at least one respective qubit may correspond to each intermediate logic input of the logic gate, at least one respective qubit may correspond to each intermediate logic output of the logic gate, and the coupling devices therebetween (as well as, in some embodiments, additional qubits) may be programmed to provide the appropriate relations between the intermediate logic input(s) and intermediate logic output(s) in order to realize the objective function corresponding to the logic gate. At 1104, each miniature optimization problem is solved, which effectively executes the logic circuit representation to determine a solution to the computational problem. Solving each miniature optimization problem may involve, for example, evolving the quantum processor from an initial state represented by the Hamiltonian described by equation 2 to a final state represented by the Hamiltonian described by equation 3. The $h_i$ and $J_{ij}$ parameters in the Hamiltonian described by equation 3 may be programmed such that respective subsets of qubits and coupling devices in the quantum processor each encode an objective function corresponding to a respective logic gate (i.e., the mapping act 1103). Evolving the quantum processor from an initial state to a final state may then involve minimizing each objective function to assign values to the intermediate logic input(s) and intermediate logic output(s) of each logic gate. In some embodiments, solving each miniature optimization problem may involve clamping at least one intermediate logic input and/or at least one intermediate logic output as described, for example, in act 232 of method 200b.

In many applications, the logic circuit representation of the computational problem includes many (e.g., 10s, 100s, 1000s, etc.) of logic gates, thus solving the computational problem by method 1100 may require solving a large number of inter-dependent miniature optimization problems, where each miniature optimization problem corresponds to a particular logic gate in the logic circuit representation. The miniature optimization problems are inter-dependent because the intermediate output(s) of a first logic gate may correspond to the intermediate input(s) of a second logic gate. The combination of all of the miniature optimization problems may be described as a single discrete optimization problem, such as a QUBO. Thus, method 1100 represents a specific implementation of methods 200a, 200b, and/or 400 where the discrete optimization problem is a set of inter-dependent miniature optimization problems. In some embodiments, multiple logic gates may be combined into a single miniature optimization problem. For example, a miniature optimization problem may, in some embodiments, encode all or a portion of a complete logical operation that comprises multiple logic gates. Those of skill in the art will appreciate that the specific mapping between logic gates and miniature optimization problems is highly instance-dependent, where it may be advantageous for some applications to implement a respective miniature optimization problem corresponding to each individual logic gate, while it may be advantageous for other applications to implement miniature optimization problems that each encode multiple (i.e., two or more) logic gates. In applications where multiple logic gates are encoded as a single miniature optimization problem, the miniature optimization problem effectively encodes an "intermediate logic circuit" and the objective function of the miniature optimization problem may exhibit a minimum value when the truth table of the miniature logic circuit is obeyed.

Throughout this specification and the appended claims, the term "miniature optimization problem" (and variations thereof) is frequently used. Unless the specific context requires otherwise, the term "miniature" here is intended to denote an optimization problem that represents a portion or component of a larger problem and comprises fewer variables and/or parameters than the larger problem. For example, an optimization problem that encodes the operation of an individual gate is a "miniature" optimization problem when that gate is part of a logic circuit representation of a larger computational problem.

The methods described herein (e.g., methods 200a, 200b, 400, and 1100) may be implemented using many different forms of processor systems. For example, many of the acts in each of methods 200a, 200b, 400, and 1100 may, in some embodiments, be performed using the same computer processor, such as a classical digital computer processor. However, in some embodiments it may be advantageous to implement a processor system that includes at least two processing subsystems, each specialized to perform a particular subset of the acts in methods 200a, 200b, 400, and 1100.

In some embodiments of the present systems and methods, a processor system may include a first processing subsystem operated to perform the generating of logic (e.g., Boolean) circuit representations (e.g., acts 201, 401, and 1101) and the encoding of these logic circuit representations as discrete optimization problems (e.g., acts 202, 402, and 1102). For example, the first processing subsystem may perform acts 201 and 202 of methods 200a and 200b and/or acts 401 and 402 of method 400, and/or acts 1101 and 1102 of method 1100. The first processing subsystem may include a classical digital computer processor including a computer- or processor-readable storage medium, such as a non-transitory storage medium or memory (e.g., volatile or non-volatile).

In some embodiments of the present systems and methods, a processor system may include a second processing subsystem operated to perform the solving of discrete optimization problems (e.g., act 203a of method 200a; acts 203b, 231-233 of method 200b; acts 403-404 of method 400;

and/or acts 1103-1104 of method 1100). In various embodiments, the second processing subsystem may be the same physical system as the first processing subsystem, or it may include a second classical digital computer processor, or it may include a quantum processor such as a superconducting quantum processor. In any case, the second processing subsystem may include a plurality of computational elements (e.g., qubits and couplers in the case of a quantum processor). The second processing subsystem may also include a programming subsystem for mapping the discrete optimization problem (which, in some embodiments, may comprise a plurality of miniature optimization problems) to the plurality of computational elements by programming the computational elements. In some embodiments, programming the computational elements includes clamping at least one logical output of the logic circuit representation of the computational problem (or at least one intermediate logical output of a particular logic gate). The second processing subsystem may also include an evolution subsystem for evolving the computational elements of the second processing subsystem. In some embodiments, evolving the computational elements of the second processing subsystem includes determining at least one logical input that corresponds to the at least one clamped logical output.

Figure 12:
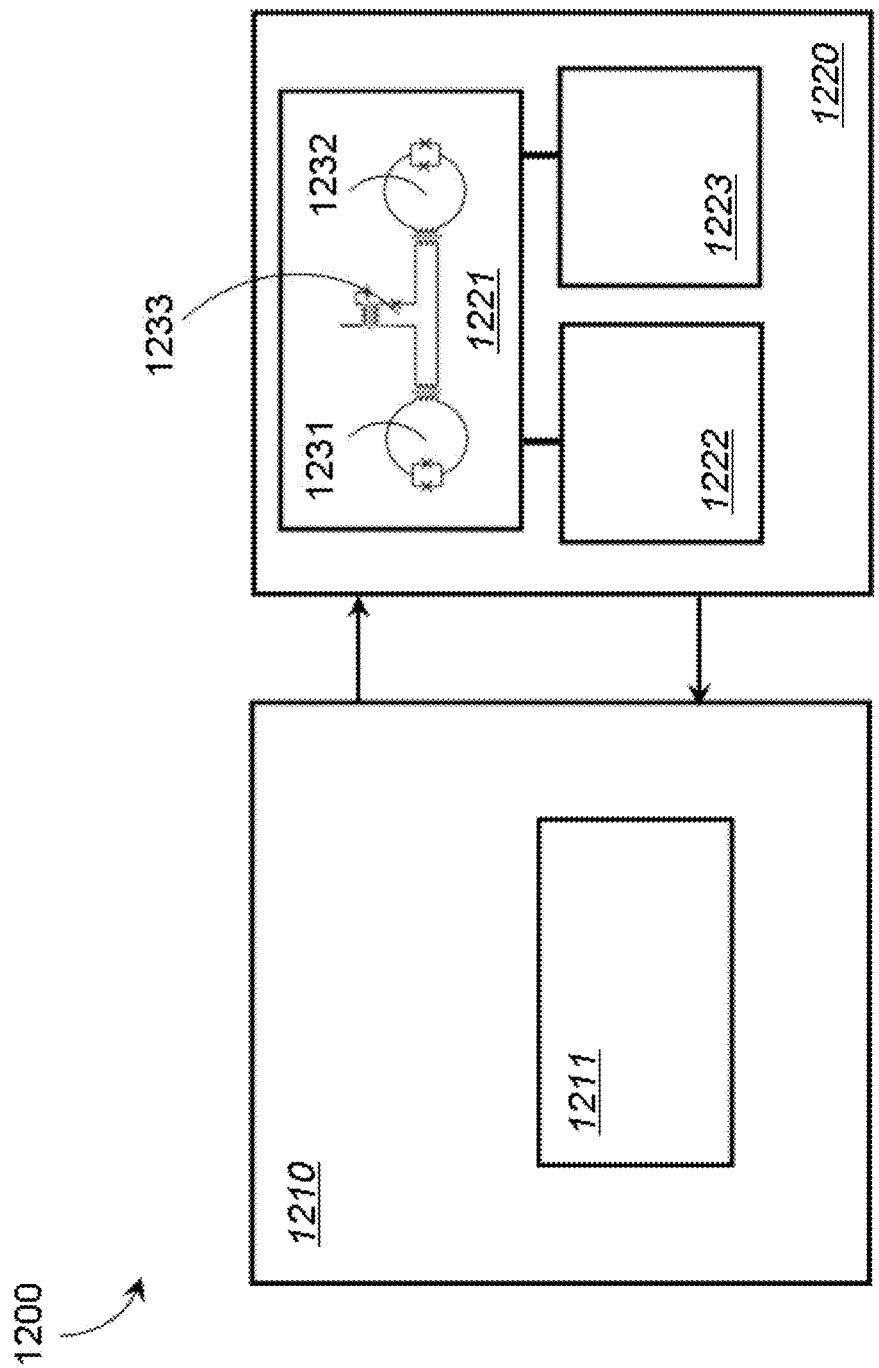
FIG. 12 is a schematic diagram of an embodiment of a processor system in accordance with the present systems and methods.

FIG. 12 is a schematic diagram of an embodiment of a processor system 1200 in accordance with the present systems and methods. Processor system 1200 includes a first processing subsystem 1210 in communication with a second processing subsystem 1220. First processing subsystem 1210 includes a computer-readable storage medium 1211 for storing and operating on at least one of a computational problem, a logic circuit representation of the computational problem, a discrete optimization problem encoding the logic circuit representation of the computational problem, and a set of miniature optimization problems each encoding a respective logic gate in the logic circuit representation of the computation problem. Second processing subsystem 1220 includes a plurality of computational elements 1221, a programming subsystem 1222, and an evolution subsystem 1223. In the illustrated embodiment, second processing subsystem 1220 includes a quantum processor; therefore, computational elements 1221 include at least two qubits 1231, 1232 and at least one coupler 1233. To reduce clutter, the interactions between computational elements 1221 and programming subsystem 1222, as well as the interactions between computational elements 1221 and evolution subsystem 1223, are not shown in FIG. 12, though those of skill in the art will appreciate that these interactions may be similar to those described in FIG. 10.

In some embodiments, the present systems and methods may be applied to solve a factoring problem, such as the problem of factoring an N-bit integer p as a product of a pair of integers a and b. Using the systems and methods described herein, this problem may be solved by representing a, b, and p in binary, constructing the logic circuit which performs the multiplication of a and b, and requiring that the circuit output give the binary representation of p. In some embodiments, the circuit can be run in "reverse" (inferring unknown inputs from known outputs) by encoding the circuit as an optimization problem and clamping the output p. By construction, input/output bit strings which satisfy the circuit may have known energy, and all other bit strings may produce an energy that is greater than the known energy. By fixing the output(s) and minimizing the resultant optimization problem, the inputs giving the desired output(s) can be obtained. The optimization problem may be crafted to be realizable using a quantum processor designed to implement adiabatic quantum computation and/or quantum annealing. In some embodiments, the optimization problem may comprise a set of inter-dependent miniature optimization problems, where each miniature optimization problem corresponds to a respective logic gate in the logic circuit representation of the factoring problem.

Figure 13:
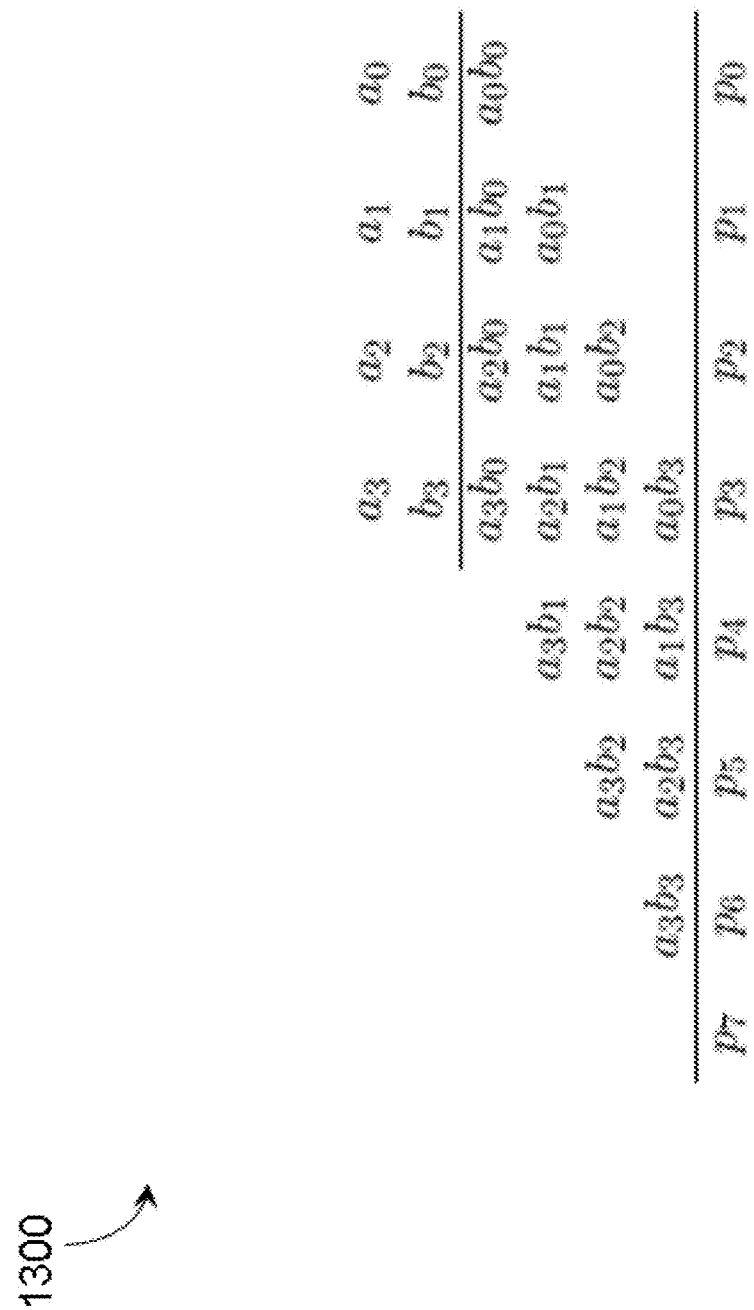
FIG. 13 is a multiplication table showing the 8-bit product of two 4-bit integers.

The product of two 4-bit integers may be, schematically, formed from the multiplication table 1300 given in FIG. 13. Any output bit $p_i$ may be formed as the sum of appropriate products of the bits of a and b. For example, the first output bit may be given by:

$$P_0 = a_0 b_0.$$

This imposes a constraint between inputs $a_0$, $b_0$ and the output $p_0$. Extensionally, this constraint may be given by the table 1400a in FIG. 14, which lists the allowed combinations of inputs and outputs. This constraint is indicated as $C\text{-}(a_0, b_0, p_0)$ so that $C\text{-}(a, b, p)$ is true for a, b, p satisfying the constraint and false otherwise. The next bit in FIG. 13 is given by:

$$p_1 = (a_1 b_0 + a_0 b_1) \bmod 2 \equiv (t+t') \bmod 2,$$

where $C\text{-}(a_1; b_0; t)$ and $C\text{-}(a_0; b_1; t')$. However, because t+t' can be as large as 2, the carry bit that may be passed on to the next larger bit (in this case $p_2$) should be considered. Indicating the carry bit by c, the allowed inputs t, t' and outputs p, c may be defined extensionally through the table 1400b in FIG. 14. This constraint, denoted $C_{2A}(t; t'; p; c)$, enforces t+t'=p+2c. $C_{2A}(t; t'; p; c)$ is the half-adder of classical digital logic. The bit $p_1$ may then be defined by:

$$C_{2A}(t,t',p_1,c) \char`\^ C\text{-}(a_1,b_0,t) \char`\^ C\text{-}(a_0,b_1,t').$$

Figure 14:
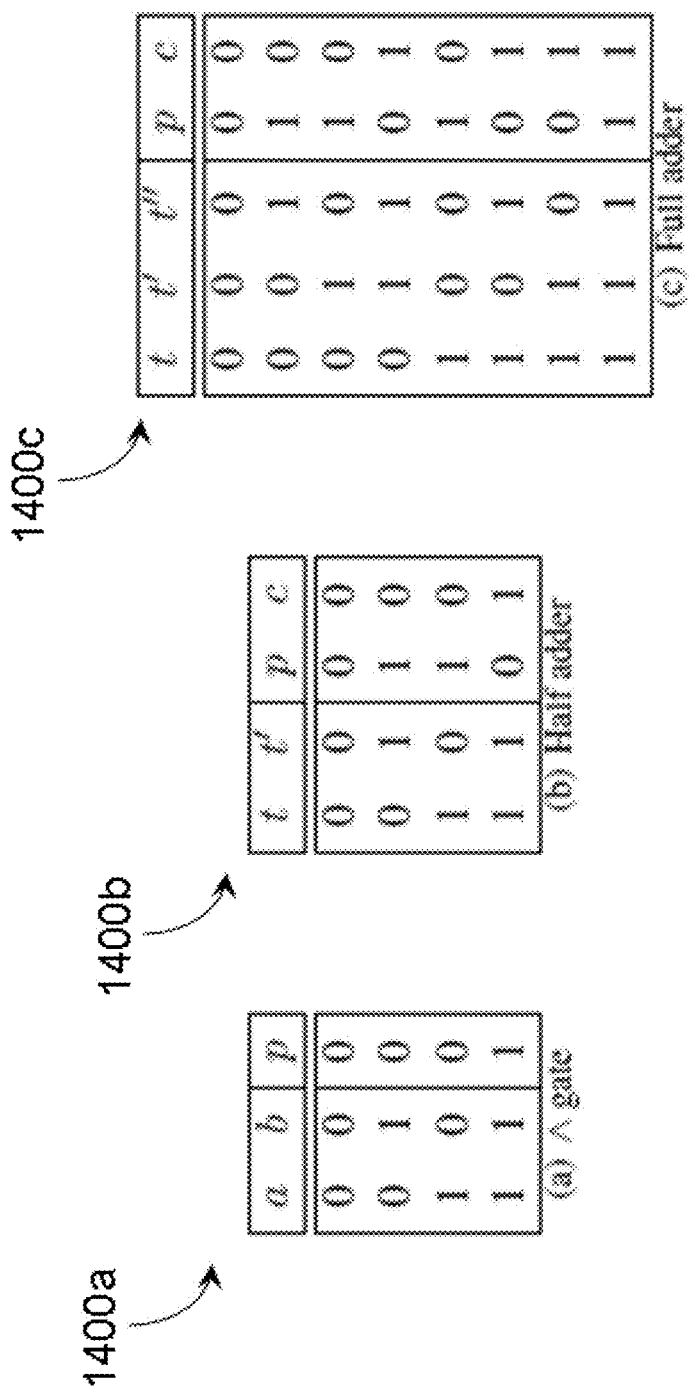
FIG. 14 shows respective truth tables for the and gate, half adder, and full adder.

To proceed to higher order bits, in some embodiments it may be convenient to define the full adder constraint $C_{3A}(t; t'; t''; p; c)$ which realizes the constraint of table 1400c in FIG. 14. This constraint is true if t+t'+t''=p+2c. If c is the carry from $p_1$, then $p_2$ and its associated carries may be determined by adding the contributions:

$$t+t'+t''+c$$

where $C\text{-}(a_2, b_0, t) \char`\^ C\text{-}(a_1, b_1, t') \char`\^ C\text{-}(a_0, b_2, t'')$. This sum can be evaluated using full- and half-adders by introducing an intermediate result r:

$$C_{3A}(r,t',t'',r,C) \char`\^ C_{2A}(r,c,p_2,c'')$$

where r=t+t'+t'' mod 2 This conjunction of constraints enforces t+t'+t''+c=$p_2$+2(c'+c''). The carries c' and c'' may then be passed to the summation determining $p_3$. Continuing in this manner for all other bits, a conjunction of constraints relating all input bits a and b to all output bits p, and to all necessary intermediate bits (such as r, c', and c'' above), can be derived.

In some embodiments, a further simplification may be made which allows elimination of most C^ constraints. As shorthand the following constraints may be defined:

$$\tilde{C}_{2A}(a,b,t,p,c) = \exists r \; C\text{-}(a,b,r) \char`\^ C_{2A}(r,t,p,c)(ab+t=p+2c)$$

$$\tilde{C}_{3A}(a,b,t,t',p,c) = \exists r \; C\text{-}(a,b,r) \char`\^ C_{3A}(r,t,t',p,c)(ab+t+t'=p+2c)$$

These constraints build the necessary ^ constraints into the adders with r representing a^b. An advantage of representing multiplication as constraint satisfaction is that it allows variables to be bound to particular values, and the values (if any) of the remaining variables which satisfy the constraints may be determined. In this way, multiplication can be run in "reverse" to infer inputs from outputs.

Having reduced factoring to constraint satisfaction, constraint satisfaction may be reduced to optimization which may then be minimized using quantum annealing and/or adiabatic quantum computation.

Consider a constraint $C(x)$ defined over a set of Boolean variables x. $C(x)$ may be represented by a penalty function $P(x)$, mapping bitstrings to the reals, defined so that:

$$P(x) = \begin{cases} o & \text{if } C(x) \\ \geq o+1 & \text{if } \neg C(x) \end{cases}.$$

The objective P encodes the feasible x as global minima having energy o, and all other infeasible x as having an energy at least o+1. In embodiments where the quantum processor can only realize up-to-quadratic functions of Boolean variables, $P(x)$ may be implemented as an up-to-quadratic function of x. In some embodiments, all the constraints $C$-, $C_{2A}$, $\tilde{C}_{2A}$, $C_{3A}$, and $\tilde{C}_{3A}$ may be realized as quadratic penalties $P$-, $P_{2A}$, $\tilde{P}_{2A}$, $P_{3A}$, and $\tilde{P}_{3A}$ as follows:

$$P_A(a, b, p) = [a\ b\ p] \begin{bmatrix} 0 & 1 & -2 \\ 0 & 0 & -2 \\ 0 & 0 & 3 \end{bmatrix} \begin{bmatrix} a \\ b \\ p \end{bmatrix}$$

$$P_{2A}(t, t', p, c) = [t\ t'\ p\ c] \begin{bmatrix} 1 & 2 & -2 & -4 \\ 0 & 1 & -2 & -4 \\ 0 & 0 & 1 & 4 \\ 0 & 0 & 0 & 4 \end{bmatrix} \begin{bmatrix} t \\ t' \\ p \\ c \end{bmatrix}.$$

$$\tilde{P}_{2A}(a, b, t, p, c) = [a\ b\ t\ p\ c] \begin{bmatrix} 0 & 1 & 2 & -2 & -4 \\ 0 & 0 & 2 & -2 & -4 \\ 0 & 0 & 1 & -4 & -6 \\ 0 & 0 & 0 & 3 & 6 \\ 0 & 0 & 0 & 0 & 8 \end{bmatrix} \begin{bmatrix} a \\ b \\ t \\ p \\ c \end{bmatrix}$$

$$P_{3A}(t, t', t'', p, c) = [t\ t'\ t''\ p\ c] \begin{bmatrix} 1 & 2 & 2 & -2 & -4 \\ 0 & 1 & 2 & -2 & -4 \\ 0 & 0 & 1 & -2 & -4 \\ 0 & 0 & 0 & 1 & 4 \\ 0 & 0 & 0 & 0 & 4 \end{bmatrix} \begin{bmatrix} t \\ t' \\ t'' \\ p \\ c \end{bmatrix}.$$

$$\tilde{P}_{3A}(a, b, t, t', p, c) = [a\ b\ t\ t'\ p\ c] \begin{bmatrix} 0 & 1 & 2 & 2 & -2 & -4 \\ 0 & 0 & 2 & 2 & -2 & -4 \\ 0 & 0 & 1 & 4 & -4 & -8 \\ 0 & 0 & 0 & 1 & -4 & -8 \\ 0 & 0 & 0 & 0 & 3 & 8 \\ 0 & 0 & 0 & 0 & 0 & 10 \end{bmatrix} \begin{bmatrix} a \\ b \\ t \\ t' \\ p \\ c \end{bmatrix}$$

All penalties may have minimum value $o=0$. The conjunction of constraints $C(x)\hat{\ }C'(x)$ may be realized by the addition of penalty functions, i.e., $P_{C\hat{\ }C''}(x)=P_C(x)+\tilde{P}_{C''}(x)$. Thus, the associated penalties may be added to represent the constraint network representing a multiplication circuit.

Figure 15:
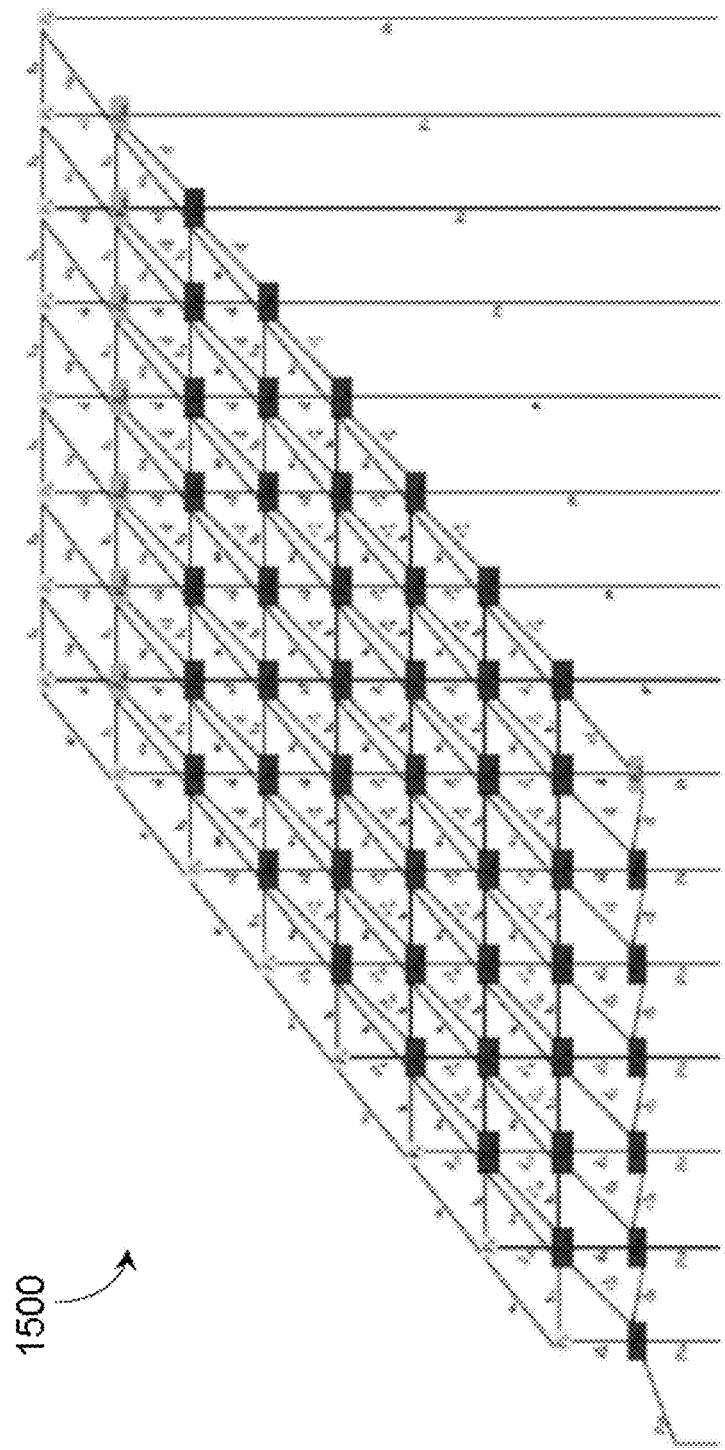
FIG. 15 is a schematic diagram showing a constraint network representing the multiplication of two 8-bit numbers.

A constraint/optimization network 1500 representing the multiplication of two 8-bit numbers is shown in FIG. 15. Optimization variables are represented as edges in the Figure. In addition to the 2N=16 variables representing a and b there are a number of intermediate variables. The $s_j^i$ variables represent the partial sums needed to evaluate the output $p_j$. There are $N(N-1)$ partial sum variables. The $c_j^i$ variables represent the carries from the output $p_j$. There are $N-2+(N-1)^2$ carry variables. Lastly, there are the 2N variables representing the product p. The total variable count is therefore $(2N+4)(N-1)+3$.

The boxes of network 1500 in FIG. 15 represent the quadratic contributions. In some embodiments, complete connectivity is advantageous locally for the variables (edges) entering the box. $P\hat{\ }$ requires $K_3$, $P_{2A}$ requires $K_4$, $\tilde{P}_{2A}$ requires $K_5$, $P_{3A}$ requires $K_5$, and $\tilde{P}_{3A}$ requires $K_6$. $K_n$ is the fully connected graph on n vertices.

The objective function encoding the multiplication of two N-bit numbers can be used to factor the 2N-bit number represented by $(p_{2N-1}; p_{2N-2}; \ldots; p_0)$. Factoring odd integers is the focus, because if p is not odd then it can be repeatedly divide by 2 until it is odd. If p is odd then the multiplicands are odd so that $a_0=b_0=1$. These variables are thus eliminated from consideration. Since the p values are known they may be eliminated as well. The p variables are eliminated by specializing the constraints in which they appear. Consequently, the specialized constraints (which are still quadratic) may be defined as:

$$P_{2A}^0(t,t',c) = P_{2A}(t,t',t'',p=0,c) P_{2A}^1(t,t',c) = P_{2A}^1(t,t',p=1,c)$$

$$P_{3A}^0(t,t',t'',c) = P_{3A}(t,t',t'',p=0,c) P_{3A}^1(t,t',t'',c) = P_{3A}(t,t',t'',p=1,c)$$

This reduces the total variable count to $(2N+1)(N-1)-1$. Eliminatina these variables leaves the optimization network 1600 defined in FIG. 16. The $P_{3A}^{p_{14}p_{15}}$ constraint in the lower left corner corresponds to the constraint $P_{3A}(a, b, t, t', p=p_{14}, c=p_{15})$.

Figure 16:
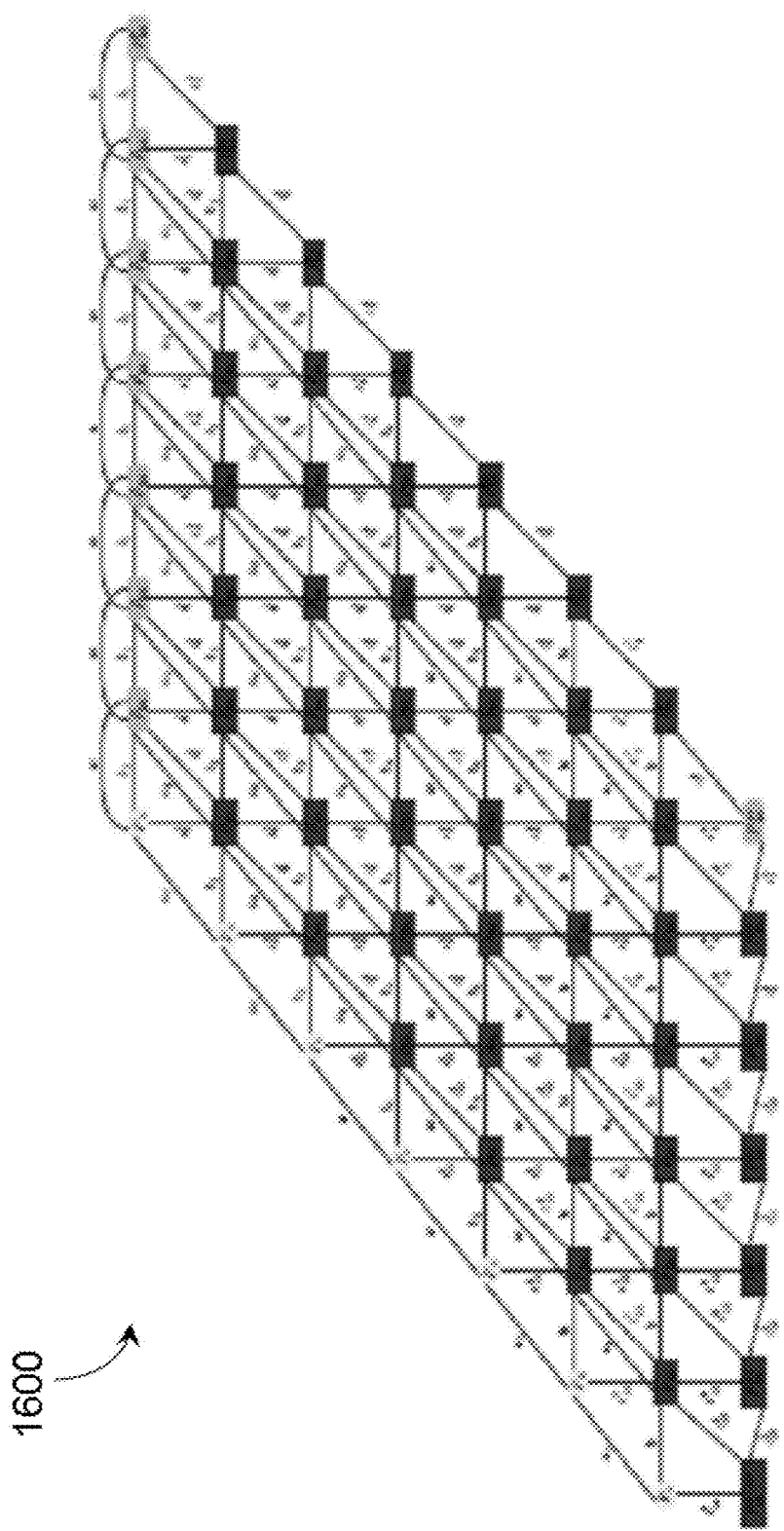
FIG. 16 is a schematic diagram showing an optimization network representing the multiplication of two odd 8-bit numbers.

In accordance with the present systems and methods, two technical considerations may require a refinement of network 1600 from FIG. 16 for hardware implementation. Firstly, any individual input bit (either $a_i$ or $b_j$) appears in many constraints and interacts with O(N) other bits. Physically, this variable may be represented in hardware as an extended element (much as it appears in FIG. 16 as the extended dark line). However, there is typically a maximum length to the extended element, and a maximum number of connections the element may support. Secondly, the precision to which distinct values in the penalty functions may be specified is typically limited, and it may be necessary to have fewer distinct weights appearing in the quadratic penalty functions.

Figure 18:
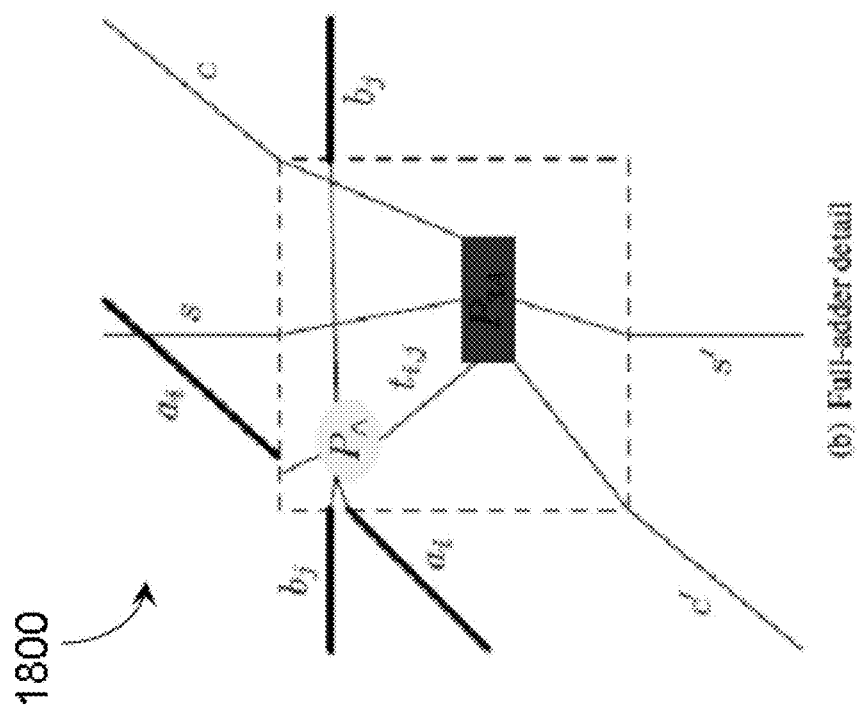
FIG. 18 is a schematic diagram showing detail of a disaggregated full adder located at the intersection of two variables.
Figure 17:
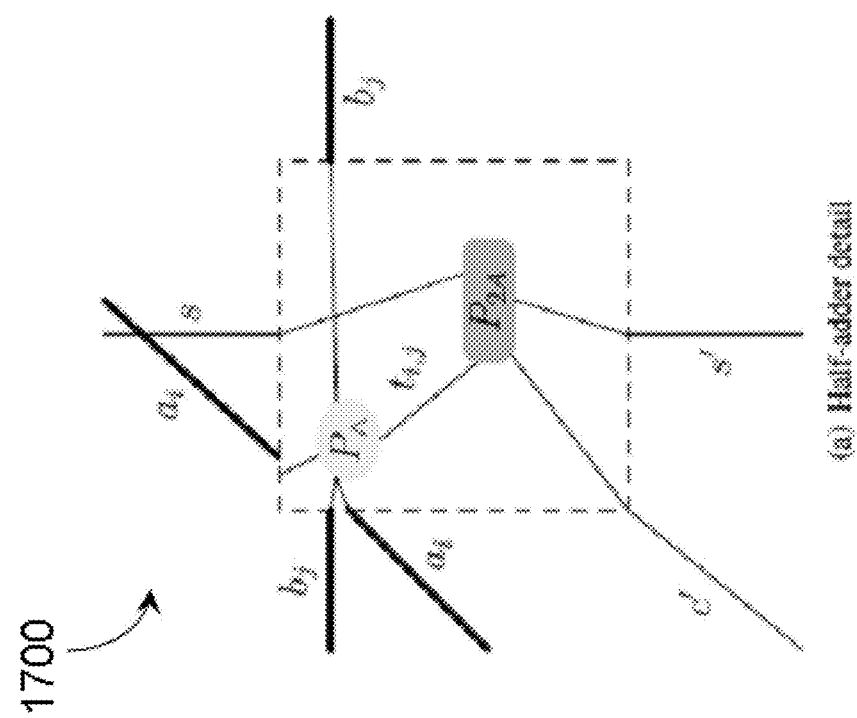
FIG. 17 is a schematic diagram showing detail of a disaggregated half adder located at the intersection of two variables.

Both these considerations can be addressed by, for example, disaggregating the $\tilde{P}$ constraints, and breaking them into their constituent components $P_{2A}$ or $P_{3A}$ and $P\hat{\ }$. The optimization network in this case may be obtained from FIG. 16 by replacing each $\tilde{P}_{2A}$ and $\tilde{P}_{3A}$ element with element 1700 from FIG. 17 and element 1800 from FIG. 18, respectively. This requires the addition of $(N-2)(N-1)$ variables $t_{i,j}$ representing the products $a_i b_j$ for $1 \leq i$; $j \leq N$. This brings the total variable count to $(3N+1)(N-1)-1$. Therefore, in some embodiments, to factor a 16-bit number may require $N=8$ and 174 variables. Without the $\tilde{P}$ constraints the required values are $\{-4; -2; 0; 1; 2; 3; 4\}$.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus of quantum computation, not necessarily the exemplary systems, methods and apparatus for quantum computation generally described above.

The various embodiments described above can be combined to provide further embodiments. All of the commonly assigned US patent application publications, US patent applications, foreign patents, foreign patent applications and non-patent publications referred to in this specification and/ or listed in the Application Data Sheet, including but not limited to U.S. Provisional Patent Application Ser. No. 61/187,987, filed Jun. 17, 2009 and entitled "Systems and Methods for Solving Computational Problems," U.S. Provisional Patent Application Ser. No. 61/238,043, filed Aug. 28, 2009 and entitled "Systems and Methods for Solving Factoring Problems," U.S. Provisional Patent Application Ser. No. 61/330,789, filed May 3, 2010 and entitled "Systems and Methods for Solving Computational Problems,", US Patent Publication No. 2006-0225165 (now U.S. Pat. No. 7,533,068), US Patent Publication 2008-0176750, U.S. patent application Ser. No. 12/266,378 published as US Patent Publication 2009-0121215, PCT Patent Application Serial No. PCT/US09/37984 published as PCT Patent Publication 2009-120638, U.S. Pat. No. 7,135,701, PCT Patent Application Serial No. PCT/US2009/044537 published as PCT Patent Publication 2009-143166, and US Patent Publication 2008-0215850 are incorporated herein by reference, in their entirety. Aspects of the embodiments can be modified, if necessary, to employ systems, circuits and concepts of the various patents, applications and publications to provide yet further embodiments.

The various problems to be solved may include problems which represent physical objects. For example, the various methods may solve problems related to geology using seismic data, for example used in oil exploration, predicting seismic activity or volcanology. Such may also be used in astronomy using information, for instance spectral information, collected via optical or radio telescopes. Such may also be use in physics or sub-atomic physics using information collected by various sensors associated with a particle collider or other piece of physics instrumentation. Such may further be used in performing analysis of actual or planned communications networks, using various measurements of network traffic, or for factoring prime numbers. Such may further be used in verification and validation of physical systems, such as hardware systems and/or software systems used in the operation of hardware systems. Various other practical problems representing physical objects may be solved.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A method of performing a quantum annealing operation using a quantum processor comprising a first set of qubits communicably coupled to a first annealing signal line, and at least a second set of qubits communicably coupled to a second annealing signal line, the method comprising:
   programming the quantum processor in a configuration that represents at least one system,
   applying a first dynamic annealing waveform to each qubit in the first set of qubits via the first annealing signal line to evolve a respective state of each qubit in the first set of qubits; and
   applying a second dynamic annealing waveform to each qubit in the second set of qubits via the second annealing signal line to evolve a respective state of each qubit in the second set of qubits,
   wherein the first dynamic annealing signal evolves differently from the second dynamic annealing signal over the course of the quantum annealing operation in order to find a low energy state of the at least one system.

2. The method of claim 1, wherein the quantum processor further comprises a third set of qubits and a third annealing signal line and the method further comprising:
   applying a third dynamic annealing waveform to each qubit in the third set of qubits via the third annealing signal line to evolve a respective state of each qubit in the third set of qubits, and wherein the first, the second and the third annealing waveforms evolve differently over the course of the quantum annealing operation.

3. The method of claim 2 wherein at least a portion of the applying the third dynamic annealing waveform occurs during at least a portion of the applying the first dynamic annealing waveform.

4. The method of claim 2 wherein at least a portion of the applying the third dynamic annealing waveform occurs during at least a portion of the applying the second dynamic annealing waveform.

5. The method of claim 2 wherein at least a portion of the applying the first dynamic annealing waveform occurs during at least a portion of the applying the second dynamic annealing waveform.

6. The method of claim 1 wherein the evolution of the first annealing waveform completes before the evolution of the second annealing waveform completes.

7. The method of claim 1 wherein the evolution of the first annealing waveform completes after the evolution of the second annealing waveform completes.

8. The method of claim 1 wherein at least one of the first or the second annealing waveforms evolve non-linearly.

9. The method of claim 1 wherein at least one of the first or the second annealing waveforms oscillate over the course of the quantum annealing operation.

10. The method of claim 1 wherein the first and the second dynamic annealing waveforms comprise values in a range of values between a minimum annealing signal value and a maximum annealing signal value;
   applying a first dynamic annealing waveform to each qubit in the first set of qubits includes applying a first dynamic annealing waveform that evolves from the maximum annealing signal value to the minimum annealing signal value; and
   applying a second dynamic annealing waveform to each qubit in the second set of qubits includes applying the second dynamic annealing waveform after the first dynamic annealing waveform reaches the minimum annealing signal value, wherein the second annealing waveform evolves from the maximum annealing signal value to the minimum annealing signal value.

11. The method of claim 10 wherein the quantum processor further comprises a third set of qubits and a third annealing signal line, the method further comprising:
   applying a third dynamic annealing waveform to each qubit in the third set of qubits via the third annealing signal line to evolve a respective state of each qubit in the third set of qubits, the third dynamic annealing waveform in a range of values between the minimum annealing signal value and the maximum annealing signal value; and
   wherein the third dynamic annealing waveform starts evolving after the second dynamic annealing waveform reaches the minimum annealing signal value and the third annealing waveform evolves from the maximum annealing signal value to the minimum annealing signal value.

12. The method of claim 11 wherein at least a portion of the applying the first dynamic annealing waveform occurs during at least a portion of the applying the second dynamic annealing waveform.

13. The method of claim 11 wherein the applying the first dynamic annealing waveform partially overlaps in time with the applying the second dynamic annealing waveform.

14. The method of claim 1, wherein programming the quantum processor further comprises:
mapping a logic circuit representation of a computational problem to the first set of qubits, at least the second set of qubits, a first set of coupling devices, and at least a second set of coupling devices in the quantum processor.

15. The method of claim 14 wherein applying a second dynamic annealing waveform to each qubit in the second set of qubits via the second annealing signal line to evolve a respective state of each qubit in the second set of qubits determines a solution to the logic circuit representation of the computational problem.

16. The method of claim 14 wherein the computational problem is selected from a group consisting of constraint satisfaction problems, discrete optimization problems, sets of miniature optimization problems, and factoring problems.

17. The method of claim 14 wherein applying a second dynamic annealing waveform to each qubit in the second set of qubits via the second annealing signal line to evolve a respective state of each qubit in the second set of qubits minimizes the computational problem, and the computational problem is minimized when the logic circuit representation of the computational problem is obeyed.

* * * * *